United States Patent
Lee et al.

(10) Patent No.: US 11,004,913 B2
(45) Date of Patent: *May 11, 2021

(54) DISPLAY APPARATUS

(71) Applicant: Samsung Display Co., LTD., Yongin-si (KR)

(72) Inventors: Dae-Young Lee, Seoul (KR); Sangho Park, Hwaseong-si (KR); Seungmin Lee, Hwaseong-si (KR); Gugrae Jo, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/751,542

(22) Filed: Jan. 24, 2020

(65) Prior Publication Data

US 2020/0161386 A1    May 21, 2020

Related U.S. Application Data

(63) Continuation of application No. 15/641,524, filed on Jul. 5, 2017, now Pat. No. 10,580,838.

(30) Foreign Application Priority Data

Jul. 19, 2016    (KR) ..................... 10-2016-0091138

(51) Int. Cl.
*H01L 27/32*        (2006.01)
*G02F 1/139*        (2006.01)
(Continued)

(52) U.S. Cl.
CPC ........ *H01L 27/3232* (2013.01); *G02F 1/1393* (2013.01); *G02F 1/133512* (2013.01); *G02F 1/133528* (2013.01); *G02F 1/133553* (2013.01); *G02F 1/134309* (2013.01); *G02F 2001/133548* (2013.01); *G02F 2001/133618* (2013.01); *G02F 2201/44* (2013.01)

(58) Field of Classification Search
CPC ......... G02F 1/133512; G02F 1/133553; G02F 1/133528; G02F 2001/133548; G02F 2001/133531; G02F 2001/133618; G02B 5/3025; H01L 27/3232; H01L 51/5281; H01L 27/3248
See application file for complete search history.

(56) References Cited

U.S. PATENT DOCUMENTS 6,710,831 B1    3/2004 Winker et al.
2002/0085143 A1    7/2002 Kim et al.
(Continued)

OTHER PUBLICATIONS

Search Report dated Dec. 7, 2017 from the European Patent Office for European Patent Application No. 17182041.8.
"55" Mirror Display Spec", AU Optronics Corporation, 2013.

*Primary Examiner* — Jia X Pan
(74) *Attorney, Agent, or Firm* — Kile Park Reed & Houtteman PLLC

(57) ABSTRACT

A display apparatus includes a first polarizer, a second polarizer facing the first polarizer, an organic light emitting element overlapping the first polarizer and the second polarizer, a first electrode and a second electrode between the first polarizer and the second polarizer and facing each other, and a liquid crystal layer between the first electrode and the second electrode.

20 Claims, 21 Drawing Sheets

(51) Int. Cl.
*G02F 1/1335* (2006.01)
*G02F 1/1343* (2006.01)
*G02F 1/13357* (2006.01)

(56) References Cited

U.S. PATENT DOCUMENTS

| | | |
|---|---|---|
| 2004/0109106 A1 | 6/2004 | Yang et al. |
| 2008/0048558 A1 | 2/2008 | Song et al. |
| 2008/0137188 A1 | 6/2008 | Sato et al. |
| 2008/0225389 A1 | 9/2008 | Oh et al. |
| 2009/0190048 A1* | 7/2009 | Hong .................. G02B 30/27 349/15 |
| 2011/0037682 A1 | 2/2011 | Takahashi et al. |
| 2011/0037683 A1 | 2/2011 | Park et al. |
| 2014/0009720 A1 | 1/2014 | Huang |
| 2014/0036339 A1 | 2/2014 | Tonar et al. |
| 2015/0146118 A1* | 5/2015 | Seo .................. G02B 30/27 349/15 |
| 2015/0219911 A1 | 8/2015 | Cho et al. |
| 2016/0062157 A1 | 3/2016 | Kim et al. |
| 2016/0104751 A1 | 4/2016 | Sagardoyburu |
| 2016/0154259 A1* | 6/2016 | Kim .................. G02F 1/1334 257/40 |
| 2017/0101819 A1 | 4/2017 | Suzuka |
| 2017/0138120 A1 | 5/2017 | Suzuka |
| 2018/0210253 A1 | 7/2018 | Kashima |

\* cited by examiner

DISPLAY APPARATUS

CROSS-REFERENCE TO RELATED APPLICATION

This is a continuation application based on currently pending U.S. patent application Ser. No. 15/641,524, filed on Jul. 5, 2017, the disclosure of which is incorporated herein by reference in its entirety. U.S. patent application Ser. No. 15/641,524 claims priority benefit of Korean Patent Application No. 10-2016-0091138, filed on Jul. 19, 2016 in the Korean Intellectual Property Office and entitled, "Display Apparatus," the disclosure of which is incorporated herein by reference in its entirety for all purposes.

BACKGROUND

1. Field

Exemplary embodiments relate to a display apparatus. More particularly, exemplary embodiments relate to a display apparatus capable of switching a display mode.

2. Description of the Related Art

A display device displays an image using a pixel emitting the light. An organic light emitting display device includes the pixel having an organic light emitting diode (OLED). The OLED emits the light of in accordance with an organic material included therein. For example, the OLED includes the organic material that emits one of red light, green light, and blue light. The organic light emitting display device displays the image by mixing the light emitted by the organic materials.

Recently, a transparent display apparatus which can display an image and transmit external light has been developed. In addition, a mirror display which can display an image and reflect external light also has been developed. However, switching between transparent or mirror functions and display function may be difficult, and display quality of multi-function displays is lower than that of a traditional display apparatus.

SUMMARY

According to an exemplary embodiment, a display apparatus includes a first polarizer, a second polarizer facing the first polarizer, an organic light emitting element overlapping the first polarizer and the second polarizer, a first electrode and a second electrode between the first polarizer and the second polarizer and facing each other, and a liquid crystal layer between the first electrode and the second electrode.

In an exemplary embodiment, the first polarizer may be a wire grid polarizer.

In an exemplary embodiment, the wire grid polarizer may include aluminum and/or silver, and has a width of at least 50 nm.

In an exemplary embodiment, a first polarizing axis of the first polarizer and a second polarizing axis of the second polarizer may be perpendicular to each other.

In an exemplary embodiment, phase of light which passes the liquid crystal layer may be maintained or retarded by 45 degree according to voltages applied to the first and second electrodes.

In an exemplary embodiment, the organic light emitting element may include a light emitting structure including a pixel electrode electrically connected to a thin film transistor, an opposite electrode facing the pixel electrode and an organic light emitting layer disposed between the pixel electrode and the opposite electrode.

In an exemplary embodiment, the organic light emitting element may include a light emitting area for displaying an image, and a transmitting area through which light passes. The pixel electrode may be disposed only at the light emitting area.

In an exemplary embodiment, the display apparatus may further include a first light blocking part disposed at a boundary of the light emitting area and the transmission area to overlap the boundary. The first light blocking part may reflect light.

In an exemplary embodiment, the second polarizer may be a wire grid polarizer, and the wire grid pattern and the first light blocking part may be formed from a same layer.

In an exemplary embodiment, the display apparatus may be driven in a mirror mode, a mirror-display mode, a transparent-display mode and transparent mode according to on/off of the organic light emitting element and the liquid crystal layer. The display apparatus, may work as a mirror in the mirror mode. The display apparatus may work as a mirror and displays an image in the mirror-display mode. The display apparatus may work as a transparent glass and displays an image in the transparent-display mode. The display apparatus may work as a transparent glass in the transparent mode.

In an exemplary embodiment, the display apparatus may further include a second light blocking part which is disposed on the first polarizer opposite to the second polarizer with respect to the first polarizer.

In an exemplary embodiment, the display apparatus may be driven in a mirror mode, a mirror-display mode, a display mode, and black mode according to on/off of the organic light emitting element and the liquid crystal layer. The display apparatus may work a mirror in the mirror mode. The display apparatus may work as a mirror and displays an image in the mirror-display mode. The display apparatus may display an image in the display mode. The display apparatus may work as a black screen in the black mode.

In an exemplary embodiment, the second polarizer may be a polyvinyl alcohol (PVA) polarizer.

In an exemplary embodiment, the display apparatus may have a front emission structure.

In an exemplary embodiment, the organic light emitting element may be disposed between the liquid crystal layer and the first polarizer.

In an exemplary embodiment, the organic light emitting element may be disposed between the liquid crystal layer and the second polarizer.

In an exemplary embodiment, the second polarizer may be disposed between the liquid crystal layer and the organic light emitting element.

According to an exemplary embodiment, a display apparatus includes a first base substrate, a third base substrate facing the first base substrate, a second base substrate disposed between the first base substrate and the third base substrate, a first polarizer disposed on the first base substrate, an organic light emitting element disposed between the first base substrate and the second base substrate, and a first electrode, a liquid crystal layer and a second electrode which are disposed between the second base substrate and the third base substrate.

In an exemplary embodiment, the first polarizer may include a wire grid polarizer including aluminum and/or silver, and having 50 nm (nanometers) or more.

In an exemplary embodiment, the display apparatus may further include a first light blocking part disposed on the third base substrate.

In an exemplary embodiment, the first light blocking part may define a plurality of openings, and reflects external light.

In an exemplary embodiment, the display apparatus may further include a second light blocking part disposed on the second base substrate.

According to an exemplary embodiment, a display apparatus includes a first polarizer including a wire grid pattern, a second polarizer facing the first polarizer, an organic light emitting element for displaying an image disposed between the first polarizer and the second polarizer, and a liquid crystal switching panel for controlling phase of light disposed between the first polarizer and the organic light emitting element or between the second polarizer and the organic light emitting element.

According to one or more embodiments, a display apparatus may include a first polarizer, an organic light emitting element, a liquid crystal layer, and a second polarizer. The display apparatus may be driven in a mirror mode, a mirror-display mode, a transparent-display mode, and a transparent mode according to driving of the liquid crystal layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
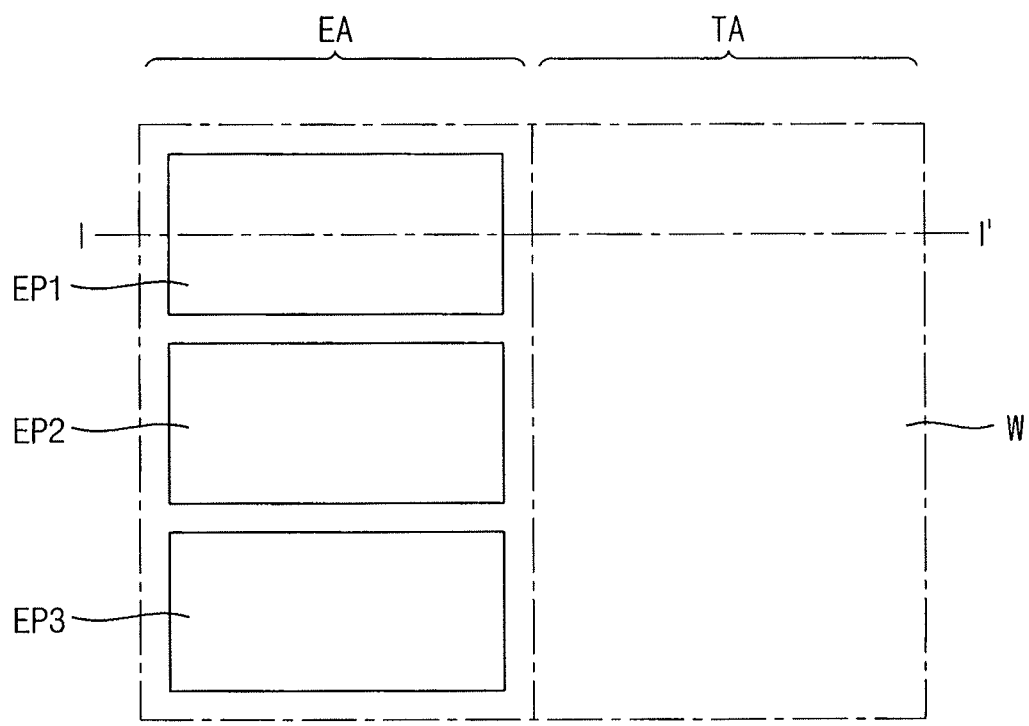
FIG. 1A illustrates a plan view of one pixel unit of a display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1B:
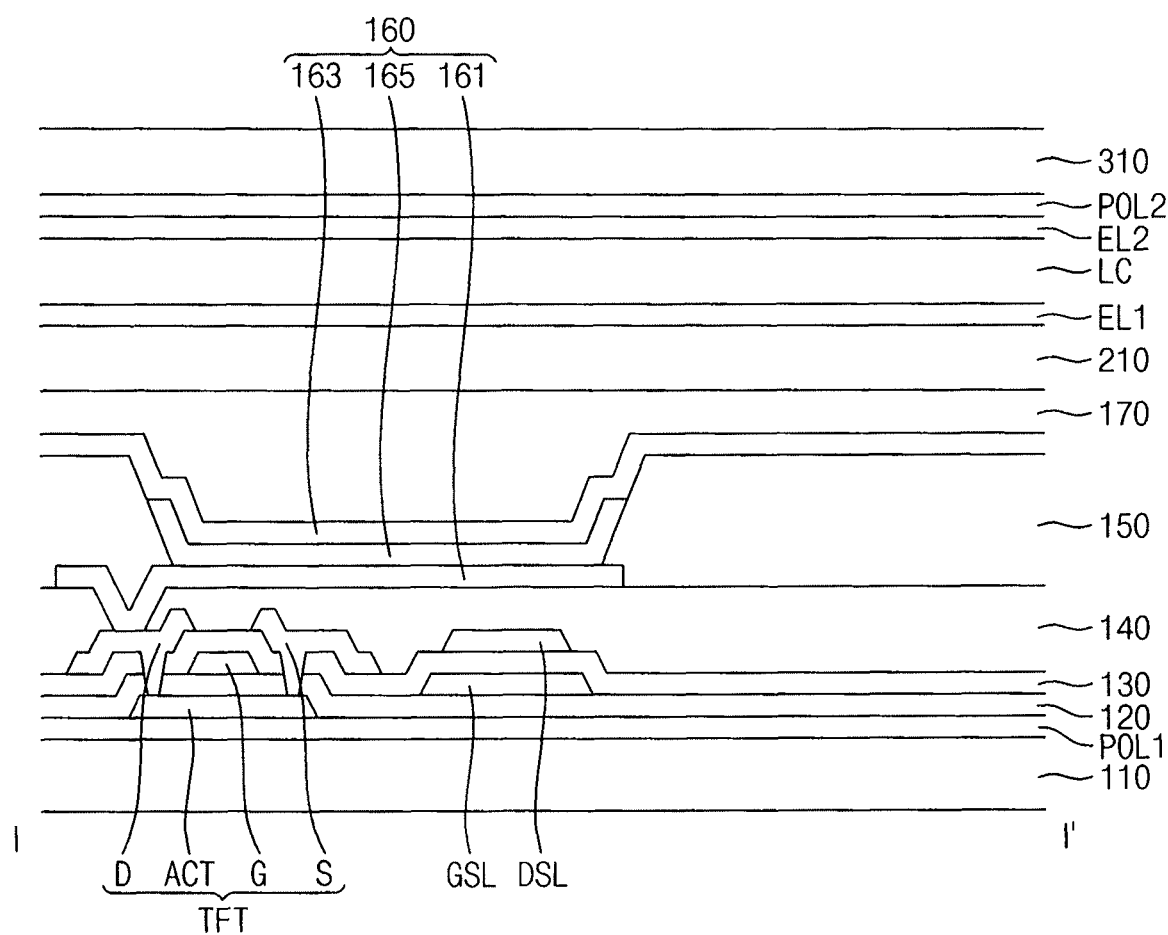
FIG. 1B illustrates a cross-sectional view taken along a line I-I' of FIG. 1A.

FIG. 1A is a plan view illustrating one pixel unit of a display apparatus according to an exemplary embodiment. FIG. 1B is a cross-sectional view taken along a line I-I' of FIG. 1A.

Referring to FIG. 1A, the pixel unit may include a transmitting area TA and a light emitting area EA. The display apparatus may include a plurality of the pixel units to display an image.

The transmitting area TA may include a transmittance window W. The transmittance window W may pass external light therethough according to a mode of the display apparatus.

The light emitting area EA may include a first light emitting portion EP1, a second light emitting portion EP2 and a third light emitting portion EP3. In addition, the light emitting area EA may further include a fourth light emitting area.

The first light emitting portion EP1, the second light emitting portion EP2 and the third light emitting portion EP3 may emit color light different from each other. For example, the first light emitting portion EP1 may emit red light, the second light emitting portion EP2 may emit green light, and the third light emitting portion EP3 may emit blue light. In addition, the first light emitting portion EP1, the second light emitting portion EP2, and the third light emitting portion EP3 may have sizes different from each other. In addition, when the light emitting area EA includes the fourth light emitting portion, the fourth light emitting portion may emit white light.

Referring to FIG. 1B, the display apparatus may include a first base substrate 110, a first polarizer POL1, a first insulation layer 120, a second insulation layer 130, a thin film transistor TFT, a planarization layer 140, a pixel defining layer 150, an organic light emitting element 160, a second base substrate 210, a first electrode EL1, a liquid crystal layer LC, a second electrode EL2, a second polarizer POL2, and a third base substrate 310, in that order.

The first base substrate 110 may include a transparent insulation substrate. For example, the first base substrate 110 may include a glass substrate, a quartz substrate, a transparent resin substrate, etc.

The first polarizer POL1 may be on the first base substrate 110, e.g., a surface facing the second base substrate 210. The first polarizer POL1 may be a wire grid polarizer. For example, the wire grid polarizer may include a wire grid pattern disposed on the first base substrate 110 and an insulation layer which covers the wire grid pattern.

The wire grid pattern of the wire grid polarizer may have about 50 nm (nanometers) to 150 nm of pitch. The pitch means sum of one wire grid width and gap between adjacent two wire grids.

The wire grid pattern may include metal having relatively high reflectance. For example, the wire grid pattern may include aluminum, silver, etc. In addition, the wire grid pattern may have enough thickness for high reflectance. For example, the wire grid pattern may have a thickness greater than about 50 nm.

In addition, a buffer layer may be further disposed on the first polarizer POL1. The buffer layer may prevent diffusion of metal atoms and/or impurities from the first polarizer POL1. The buffer layer may be formed using a silicon compound. For example, the buffer layer may include silicon oxide (SiOx), silicon nitride (SiNx), silicon oxynitride (SiOxNy), silicon oxycarbide (SiOxCy), silicon carbon nitride (SiCxNy), etc.

The active pattern ACT may be disposed on the first polarizer POL1. The active pattern ACT may include source area and drain area, both doped with an impurity, and a channel area between the source area and the drain area.

In some example embodiment, a semiconductor layer may be formed on the first polarizer POL1, and then a preliminary active layer may be formed on the first polarizer POL1 by patterning the semiconductor layer. The crystallization process may be performed about the preliminary active layer to form the active pattern ACT on the first polarizer POL1.

The first insulation layer 120 may be disposed on the first polarizer POL1 and the active pattern ACT is disposed. The first insulation layer 120 may be formed by a chemical vapor deposition (CVD) process, a spin coating process, a plasma enhanced chemical vapor deposition (PECVD) process, a sputtering process, a vacuum evaporation process, a high density plasma-chemical vapor deposition (HDP-CVD) process, a printing process, etc. In addition, the first insulation layer 120 may include a silicon compound, metal oxide, etc. In example embodiments, the first insulation layer 120 may be uniformly formed on the first polarizer POL1 along a profile of the active pattern ACT. Here, the first insulation layer 120 may have a substantially small thickness, such that a stepped portion may be formed at a portion of the first insulation layer 120 adjacent to the active pattern ACT. In some example embodiments, the first insulation layer 120 may have a relatively large thickness for sufficiently covering the active pattern ACT, so that a surface of the first insulation layer 120 opposite the active pattern may have a substantially level surface.

A gate pattern may be disposed on the first insulation layer 120. A first conductive layer may be formed on the first insulation layer 120, and then the first conductive layer may be partially etched by a photolithography process or an etching process using an additional etching mask, to form the gate patterns. The gate pattern may include metal, alloy, metal nitride, conductive metal oxide, a transparent conductive material, etc. In addition, the gate pattern may have a single layer structure or a multilayer structure. The gate pattern may include a gate electrode G which overlaps the active pattern ACT, a gate signal line GSL, e.g., a gate line for transmitting signals to drive the pixel and a first storage electrode.

The second insulation layer 130 may be disposed on the first insulation layer 120 and the gate pattern. The second insulation layer 130 may insulate a source electrode S and a drain electrode D from the gate electrode G. The second insulation layer 130 may be uniformly formed on the first insulation layer 120 along a profile of the gate pattern. Here, the second insulation layer 130 may have a substantially small thickness, such that a stepped portion may be formed at a portion of the second insulation layer 130 adjacent to the gate pattern. The second insulation layer 130 may be formed using a silicon compound. In a addition, the second insulation layer 130 may be obtained by a spin coating process, a CVD process, a PECVD process, a HDP-CVD process, etc. In some example embodiment, the second insulation layer 130 may have a single layer structure or a multilayer structure.

A data pattern may be disposed on the second insulation layer 130. The data pattern may include the source electrode S and the drain electrode D, a data signal line DSL such as a data line for transmitting signals to drive the pixel and a second storage electrode. The source electrode S may be electrically connected to the active pattern ACT through a contact hole formed through the first insulation layer 120 and the second insulation layer 130. The drain electrode D may be electrically connected to the active pattern ACT through a contact hole formed through the first insulation layer 120 and the second insulation layer 130.

In some example embodiment, the contact holes may be formed by partially etching the second insulation layer 130 and the first insulation layer 120. The contact holes may expose a portion of the source and drain area. A second conductive layer may be formed on the second insulation layer 130 to fill the contact holes and patterned to form the data pattern. The data pattern may include metal, alloy, metal nitride, conductive metal oxide, a transparent conductive material, etc. The data pattern may have a single layer structure or a multilayer structure.

The active pattern ACT, the gate electrode G, the source electrode S and the drain electrode D may be form a thin film transistor TFT.

The planarization layer 140 may be disposed on the second insulation layer 130 and the thin film transistor TFT. The planarization layer 140 may have a single-layered structure or a multilayered structure including at least two insulation films. In example embodiments, a planarization process may be performed on the planarization layer 140 to enhance the flatness of the planarization layer 140. For example, the planarization layer 140 may have a substantially level surface by a chemical mechanical polishing (CMP) process, an etch-back process, etc. The planarization layer 140 may be formed using an organic material. In some example embodiment, the planarization layer 140 may be formed by using an inorganic material, e.g., a silicon compound, metal oxide, etc. The planarization layer 140 may be obtained by a spin coating process, a printing process, a sputtering process, a CVD process, an atomic layer deposition (ALD) process, a PECVD process, an HDP-CVD process, a vacuum evaporation process, etc., in accordance with materials used in the planarization layer 140.

The planarization layer 140 may be partially etched by a photolithography process or an etching process using an additional etching mask. A contact hole which exposes the drain electrode D of the thin film transistor TFT through the planarization layer 140 may be formed.

The organic light emitting element 160 may include a pixel electrode 161, an opposite electrode 163 facing the pixel electrode 161, a light emitting structure 165 disposed between the pixel electrode 161 and the opposite electrode 163.

The pixel electrode 161 may be disposed on the planarization layer 140 to fill the contact hole. Thus, the pixel electrode 161 may make contact with the drain electrode D exposed by the contact hole. The pixel electrode 161 may be disposed corresponding to a light emitting area (EA of FIG. 1A).

In some example embodiments, a contact, a plug, or a pad may be formed in the contact hole on the drain electrode D, and then the pixel electrode 161 may be formed on the contact, the plug or the pad. Here, the pixel electrode 161 may be electrically connected to the drain electrode D through the contact, the plug, or the pad.

The display apparatus may have front emission structure. The pixel electrode 161 may include reflective material. For example, the pixel electrode 161 may include aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in combination.

The pixel defining layer 150 may be disposed on the planarization layer 140 on which the pixel electrode 161 is disposed. The pixel defining layer 150 may include an organic material or an inorganic material. For example, the pixel defining layer 150 may be formed using photoresist, acryl-based resin, polyacryl-based resin, polyimide-based resin, a silicon compound, etc. The pixel defining layer 150 may transmit external light therethrough, and may be disposed corresponding to a transparent area (TA of FIG. 1A).

In addition, the pixel defining layer 150 may be obtained by a spin coating process, a spray process, a printing process, a CVD process, etc. In example embodiments, the pixel defining layer 150 may be partially etched to form an opening partially exposing the pixel electrode 161. In some example embodiments, the opening may be defined by removing a portion of the pixel defining layer 150 corresponding to a transmittance window (W of FIG. 1A). In some example embodiments, a portion of the planarization layer 140, a portion of the first insulation layer 120 and/or a portion of the second insulation layer 130 in an area corresponding to the transmittance window may be removed to further define the opening.

The light emitting structure 165 be on the pixel electrode 161 exposed by the opening of the pixel defining layer 150. The light emitting structure 165 may be formed by a laser induced thermal imaging process, a printing process, etc. The light emitting structure 165 may include an organic light emitting layer (EL), a hole injection layer (HIL), a hole transfer layer (HTL), an electron transfer layer (ETL), an electron injection layer (EIL), etc. In example embodiments, a plurality of organic light emitting layers may be formed using light emitting materials for generating different colors of light, e.g., red light (R), green light (G), and blue light (B) in accordance with color pixels of the display device. In some example embodiments, the organic light emitting layer of the of the light emitting structure 165 may include a plurality of stacked light emitting materials for generating red light, green light, and blue light to thereby emit white light. Here, the display apparatus may further include color filters to output colored light from the white light.

The opposite electrode 163 may be disposed on the pixel defining layer 150 and the light emitting structure 165. The display apparatus may have front emission structure. The opposite electrode 163 may include a transmissive material. For example, the opposite electrode 163 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in combination. Additionally, the opposite electrode 163 may be formed by a printing process, a sputtering process, a CVD process, an ALD process, a vacuum evaporation process, a pulsed laser deposition (PLD) process, etc. In example embodiments, the opposite electrode 163 may also have a single layer structure or a multilayer structure, which may include a metal film, an alloy film, a metal nitride film, a conductive metal oxide film, and/or a transparent conductive film.

The pixel electrode 161 may be an anode electrode and the opposite electrode 163 may be a cathode electrode. In some example embodiments, the pixel electrode 161 may be a cathode electrode, and the opposite electrode 163 may be an anode electrode.

The second base substrate 210 may be disposed on the opposite electrode 163. The second base substrate 210 may include a glass substrate, a quartz substrate, a transparent resin substrate, etc.

In example embodiments, a predetermined space 170 may be provided between the opposite electrode 163 and the second base substrate 210. This space 170 may be filled with an air or an inactive gas such as a nitrogen ($N_2$) gas. In some example embodiments, a protection layer may be additionally disposed between the opposite electrode 163 and the second base substrate 210. The protection layer may include a resin, e.g., photoresist, acryl-based resin, polyimide-based resin, polyamide-based resin, siloxane-based resin, etc. These may be used alone or in combination. In some example embodiments, a thin film encapsulation layer may be formed on the opposite electrode 163 instead of the second base substrate 210. For example, the thin film encapsulation layer may include an inorganic film, e.g., silicon oxide or silicon nitride film, and an organic film, e.g., epoxy or polyimide film, which are alternately and repeatedly stacked. However, example embodiments of the thin film encapsulation layer may be not limited thereto, any transparent thin film for sealing may be applied.

The first electrode EL1 may be disposed on the second substrate 210. A first voltage may be applied to the first electrode EL1 to form electric field at the liquid crystal layer LC. The first electrode EL1 may have various shapes as required. The first electrode EL1 may include a transparent conductive material. For example, the first electrode EL1 may include indium tin oxide (ITO) or indium zinc oxide (IZO).

The second electrode EL2 may face the first electrode EL1. A second voltage may be applied to the second electrode EL2 to form the electric field at the liquid crystal layer LC. The second electrode EL2 may have various shapes as required. The second electrode EL2 may include a transparent conductive material. For example, the second electrode EL2 may include indium tin oxide (ITO) or indium zinc oxide (IZO).

The liquid crystal layer LC may be disposed between the first electrode EL1 and the second electrode EL2. The liquid crystal layer LC may include liquid crystal molecules having optical anisotropy. The liquid crystal layer LC may be turned on/off by the electric field formed by the first electrode EL1 and the second electrode EL2. The first and second voltage is applied to the first electrode EL1 and the second electrode EL2, such that a voltage difference is formed between the first electrode EL1 and the second electrode EL2 to form the electric field between the first electrode EL1 and the second electrode EL2, to turn on the liquid crystal layer LC (on state). When the voltages are not applied to the first electrode EL1 and the second electrode EL2 or the same voltage is applied to the first electrode EL1 and the second electrode EL2, the electric field is not formed, so that the liquid crystal layer LC is turned off (off state). Functions of the liquid crystal layer LC according to on/off state of the liquid crystal layer LC will be mentioned in detail later.

The second polarizer POL2 may be disposed on the second electrode EL2. The second polarizer POL2 may be a wire grid polarizer, a polyvinyl alcohol (PVA) polarizer, etc. A polarizing axis of the second polarizer POL2 may be perpendicular to a polarizing axis of the first polarizer POL1.

The third base substrate 310 may be disposed on the second polarizer POL2. The third base substrate 310 may include a glass substrate, a quartz substrate, a transparent resin substrate, etc. In some example embodiments, a thin film encapsulation layer may be formed on the second polarizer POL2 instead of the third base substrate 310. An upper surface of the thin film encapsulation layer may be flat.

When the liquid crystal layer LC is in the on state, the liquid crystal layer LC may be function as an optical retarder. For example, when the liquid crystal layer LC is in the on state, phase of light passing through the liquid crystal layer LC may be retarded by 45 degree. When the liquid crystal layer LC is in the off state, the liquid crystal layer LC may not change the phase of the light passing through the liquid crystal layer LC. Alternatively, the liquid crystal layer LC may be designed to be an optical retarder when the liquid crystal layer LC is in the off state.

Figure 2:
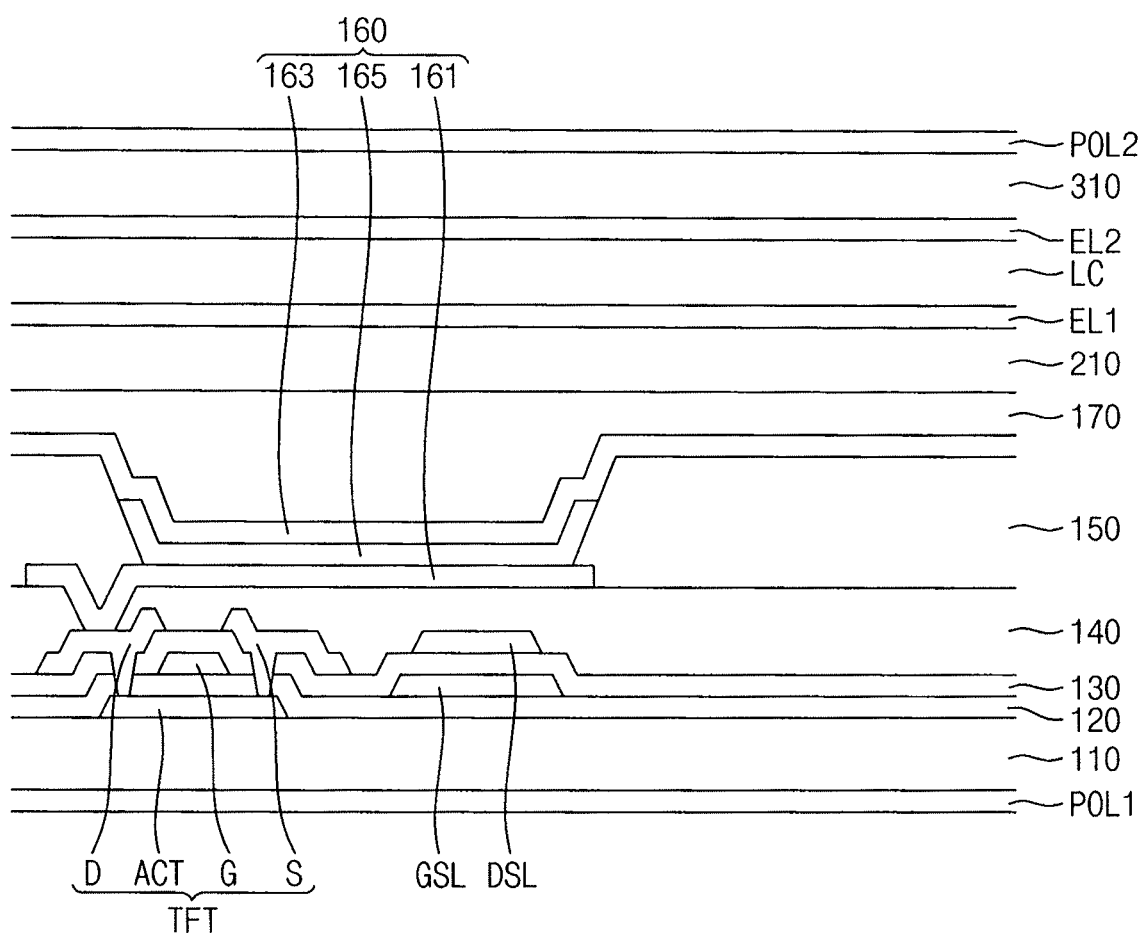
FIG. 2 illustrates a cross-sectional view of a display apparatus according to an exemplary embodiment.

FIG. 2 is a cross-sectional illustrating a display apparatus according to an exemplary embodiment. Referring to FIG. 2, the display apparatus may be substantially same as the display apparatus of FIGS. 1A to 1B, except for positions of the first and second polarizer POL1 and POL2. Thus, any further detailed descriptions concerning the same elements will be omitted or briefly described.

The display apparatus may include the first polarizer POL1, the first insulation layer 120, the second insulation layer 130, the thin film transistor TFT, the planarization layer 140, the pixel defining layer 150, the organic light emitting element 160, the second base substrate 210, the first electrode EL1, the liquid crystal layer LC, the second electrode EL2, the third base substrate 310 and the second polarizer POL2, in that order.

The first polarizer POL1 may be disposed on the first base substrate 110, e.g., on a surface opposite the surface facing the second base substrate 210. The second polarizer POL2 may be disposed on a surface of the third base substrate 310 which is opposite to a surface on which the second electrode EL2 is disposed.

Figure 3A:
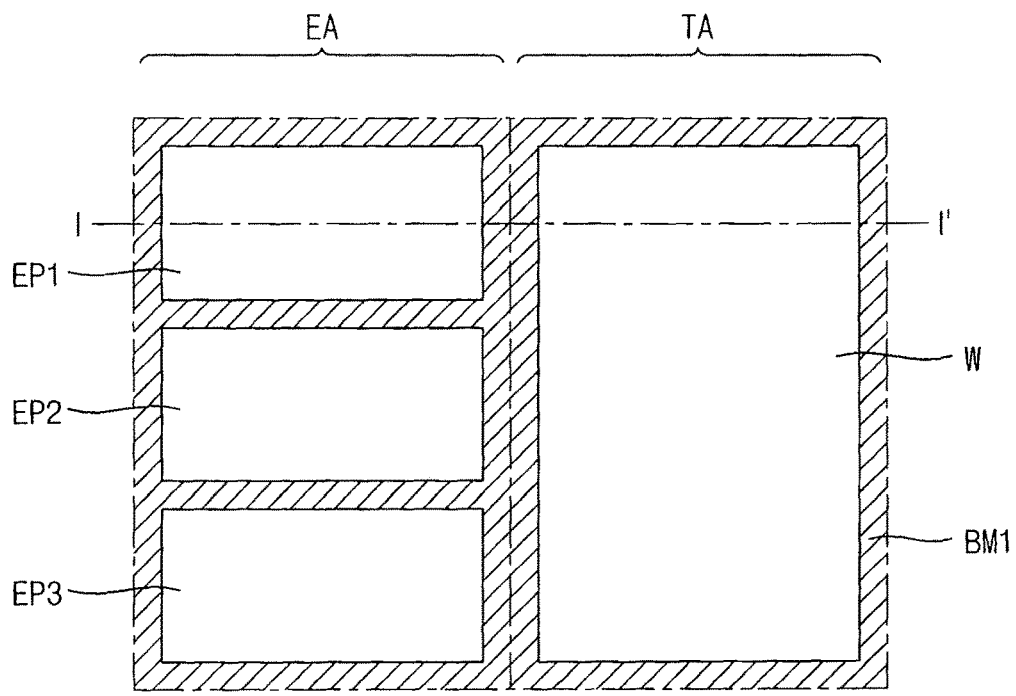
FIG. 3A illustrates a plan view of one pixel unit of a display apparatus according to an exemplary embodiment.
Figure 3B:
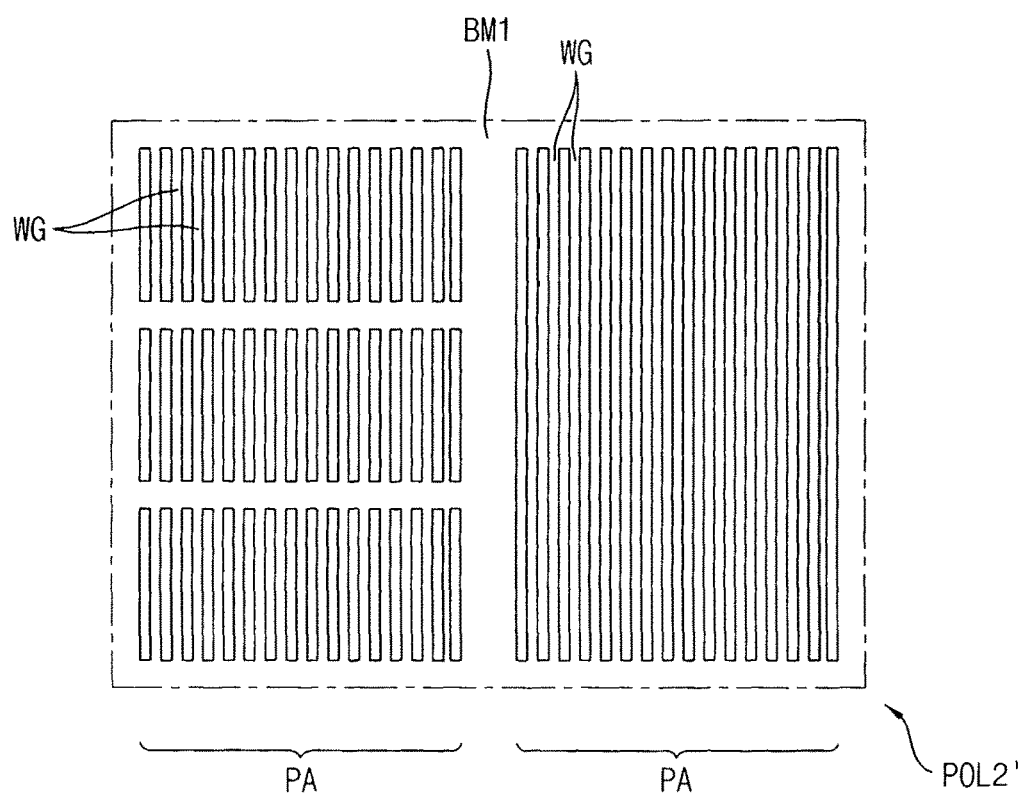
FIG. 3B illustrates a plan view illustrating a first polarizer of the display apparatus of FIG. 3A.
Figure 3C:
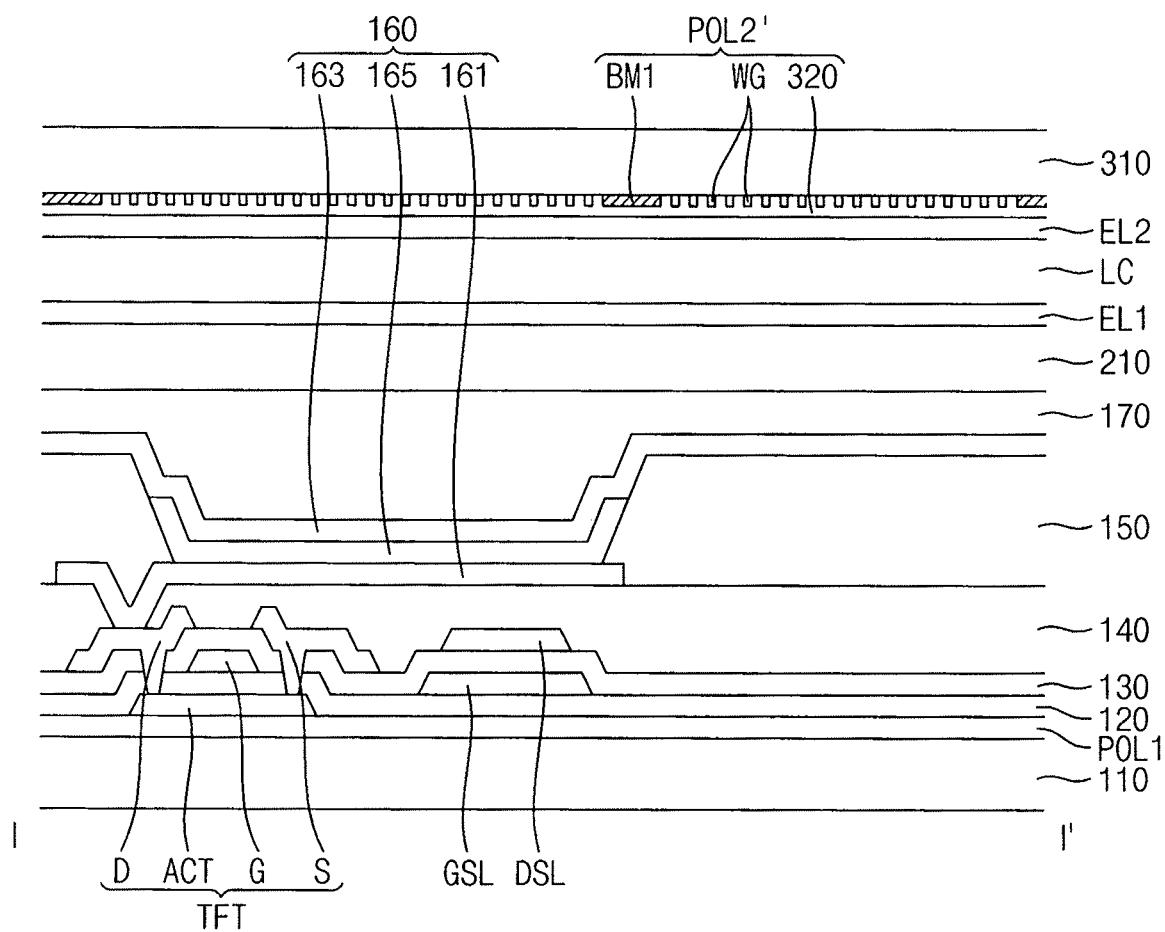
FIG. 3C illustrates a cross-sectional view taken along a line I-I' of FIG. 3A.

FIG. 3A is a plan view illustrating one pixel unit of a display apparatus according to an exemplary embodiment. FIG. 3B is a plan view illustrating a first polarizer of the display apparatus of FIG. 3A. FIG. 3C is a cross-sectional view taken along a line I-I' of FIG. 3A. The display apparatus may be substantially same as the display apparatus of FIGS. 1A and 1B, except for a second polarizer POL2'. Thus, any further detailed descriptions concerning the same elements will be briefly explained or omitted.

Referring to FIG. 3A, the pixel unit may include a transmitting area TA and a light emitting area EA. The display apparatus may include a plurality of the pixel unit to display an image. A light blocking part BM1 may be formed at a boundary of the first light emitting portion EP1, the second light emitting portion EP2, the third light emitting portion, and the transmittance window W.

The first light blocking part BM1 may reflect the external light. The first light blocking part BM1 may include metal having relatively high reflectance. For example, the first light blocking part BM1 may include aluminum, silver, etc.

Referring to FIG. 3C, the display apparatus may include the first base substrate 110, the first polarizer POL1, the first insulation layer 120, the second insulation layer 130, the thin film transistor TFT, the planarization layer 140, the pixel defining layer 150, the organic light emitting element 160, the second base substrate 210, the first electrode EL1, the liquid crystal layer LC, a second electrode EL2, the second polarizer POL2', and the third base substrate 310, in that order.

The second polarizer POL2' may be disposed on the second electrode EL2. The second polarizer POL2 may include a wire grid pattern WG, the first light blocking part BM1, and an insulation layer 320.

The wire grid pattern WG may be disposed on the third base substrate 310. The wire grid pattern WG may has a pitch about 50 nm (nanometers) to 150 nm. The pitch means sum of a width of one wire grid and a distance between wire grids adjacent to each other. The wire grid pattern WG may include a metal having relatively high reflectance. For example, the wire grid pattern WG may include aluminum, silver, etc.

The first light blocking part BM1 may be disposed on the third base substrate 310. The first light blocking part BM1 may be disposed on a same plane on which the wire grid pattern WG is disposed. The first light blocking part BM1 may define openings. The first light blocking part BM1 may reflect the external light. The first light blocking part BM1 may include a material same as the wire grid pattern WG. The first light blocking part BM1 may include a metal having relatively high reflectance. For example, the first light blocking part BM1 may include aluminum, silver, etc.

Referring to FIGS. 3A and 3B, the wire grid pattern WG may be disposed corresponding to a polarizing area PA. The polarizing area PA may correspond to the opening of the first light blocking part BM1, and each of the openings may be formed corresponding to each other the first light emitting portion EP1, the second light emitting portion EP2, the third light emitting portion EP3 of the light emitting area EA, and the transmittance window W.

The wire grid pattern WG and the first light blocking part BM1 may be formed by patterning a metal layer formed on the third base substrate 310. For example, the metal layer including aluminum, silver, etc., may be formed on the third base substrate 310, and then the metal layer may be patterned, e.g., using a nano-imprint lithography method, to form the wire grid pattern WG and the first light blocking part BM1.

The insulation layer 320 may be disposed on the wire grid pattern WG and the first light blocking part BM1 to insulate the second electrode EL2 from the wire grid pattern WG and the first light blocking part BM1.

The third base substrate 310 may be disposed on the second polarizer POL2'. The third base substrate 310 may include a glass substrate, a quartz substrate, a transparent resin substrate, etc. A polarizing axis of the second polarizer POL2' may be perpendicular to a polarizing axis of the first polarizer POL1

According to the present example embodiment, mirror function of the display apparatus may be improved due to the first light blocking part BM1 which reflects the external light.

Figure 4A:
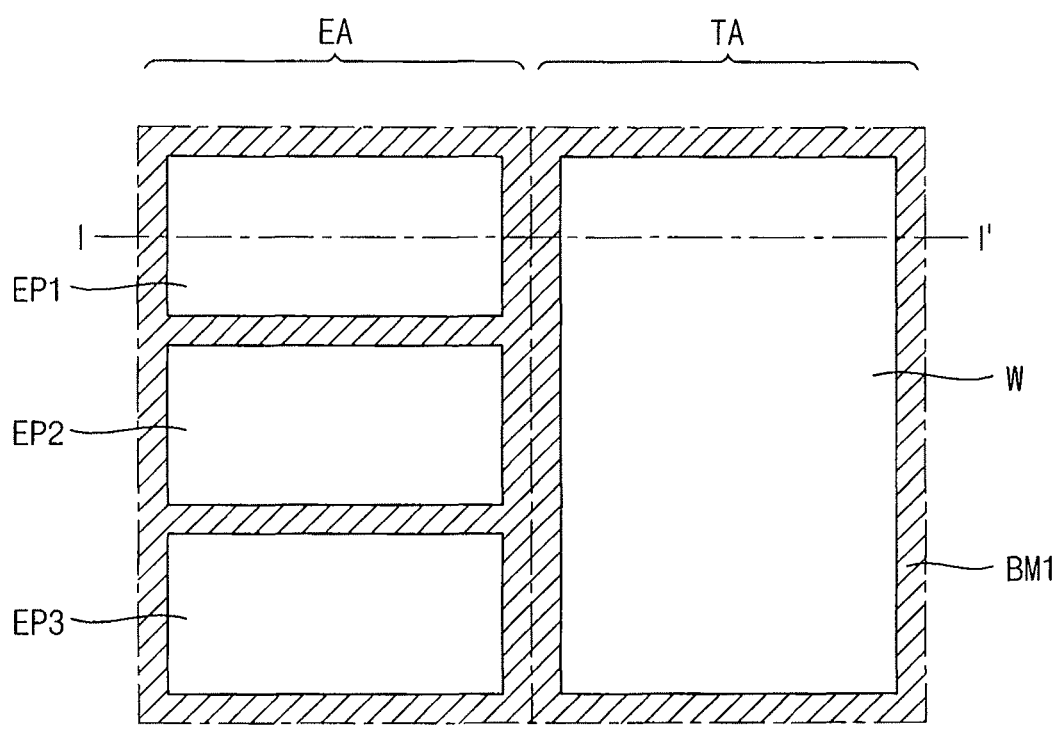
FIG. 4A illustrates a plan view of one pixel unit of a display apparatus according to an exemplary embodiment.
Figure 4B:
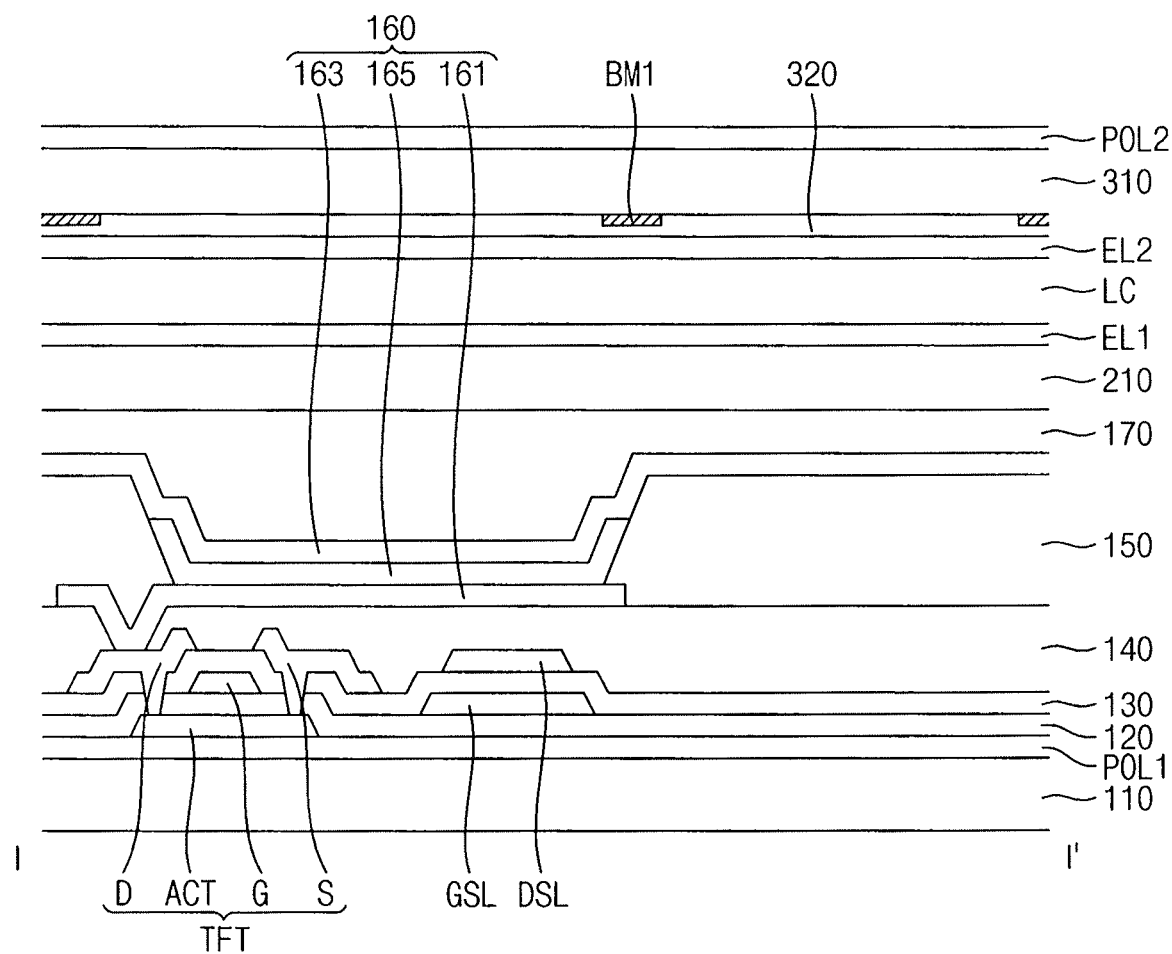
FIG. 4B illustrates a cross-sectional view taken along a line I-I' of FIG. 4A.

FIG. 4A is a plan view illustrating one pixel unit of a display apparatus according to an exemplary embodiment. FIG. 4B is a cross-sectional view taken along a line I-I' of FIG. 4A.

Referring to FIGS. 4A and 4B, the display apparatus may be substantially same as the display apparatus of FIG. 2, except for the inclusion of the first light blocking part BM1. Also, unlike illustrated in FIGS. 3A to 3C, the first light blocking part BM1 is not on the same plane of the wire grid pattern WG. Thus, any further detailed descriptions concerning the same elements will be omitted or briefly described.

The first light blocking part BM1 may be disposed between the third base substrate 310 and the second electrode EL2, e.g., may be on a surface of the third base substrate facing the liquid crystal layer LC. The second polarizer POL2 may be disposed on a surface of the third base substrate 310 which is opposite to a surface on which the first light blocking part BM1 is disposed.

The first light blocking part BM1 may define openings and may reflect the external light. The insulation layer 320 may be disposed between the first light blocking part BM1 and the second electrode EL2 to insulate the second electrode EL2 from the first light blocking part BM1.

Figure 5:
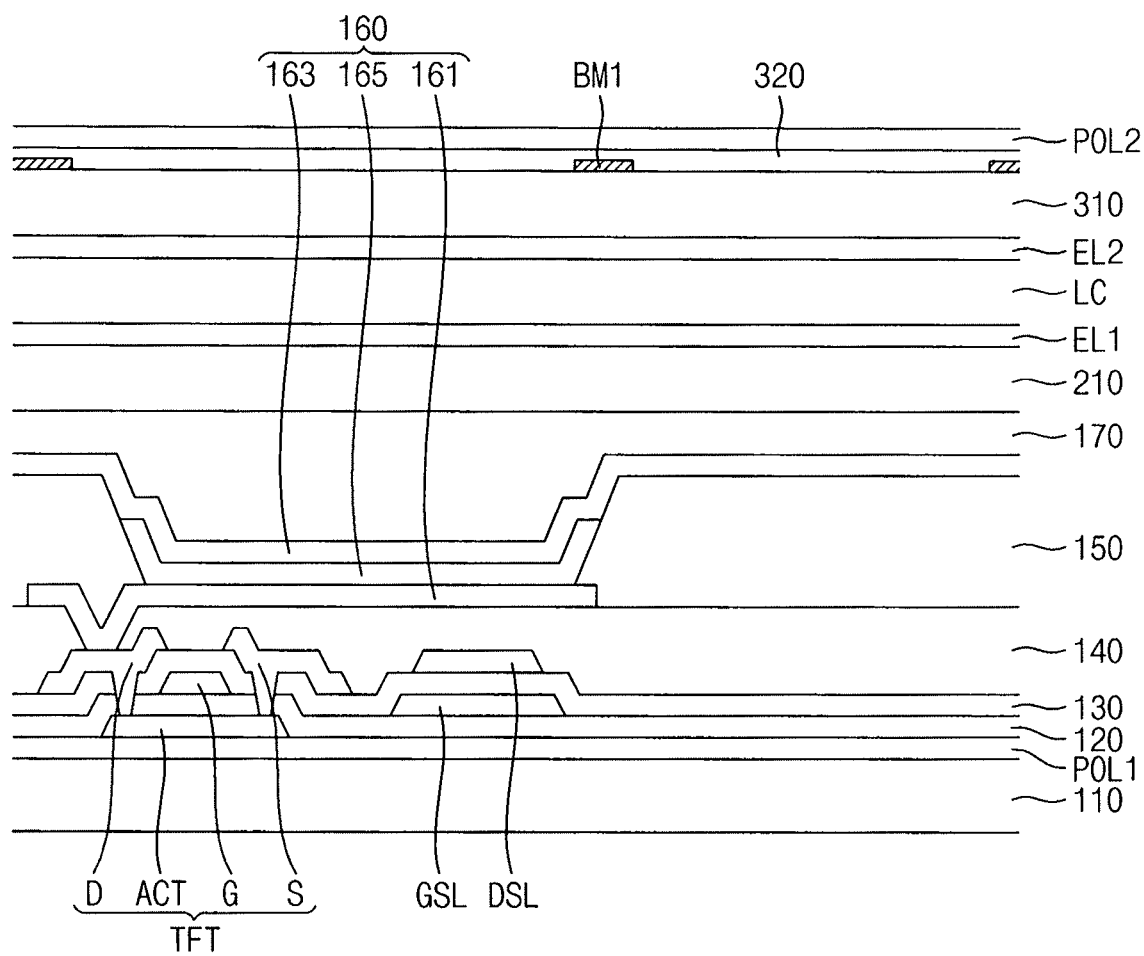
FIG. 5 illustrates a cross-sectional of a display apparatus according to an exemplary embodiment.

FIG. 5 is a cross-sectional illustrating a display apparatus according to an exemplary embodiment. Referring to FIG. 5, the display apparatus may be substantially same as the display apparatus of FIGS. 4A and 4B, except for the position of the first light blocking part BM1, the insulation layer 320, and the second polarizer POL2. Thus, any further detailed descriptions concerning the same elements will be omitted or briefly described.

Referring to FIG. 5, the display apparatus may include the first base substrate 110, the first polarizer POL1, the first insulation layer 120, the second insulation layer 130, the thin film transistor TFT, the planarization layer 140, the pixel defining layer 150, the organic light emitting element 160, the second base substrate 210, the first electrode EL1, the liquid crystal layer LC, the second electrode EL2, the third base substrate 310, the first light blocking part BM1, the insulation layer 320, and the second polarizer POL2, in that order.

The first light blocking part BM1 may be disposed on the third base substrate 310. The insulation layer 320 may be disposed on the first light blocking part BM1 to cover the first light blocking part BM1. The insulation layer 320 may be an adhesive layer to attach the second polarizer POL2 on the third base substrate 310. The second polarizer POL2 may be disposed on the insulation layer 320.

Figure 6:
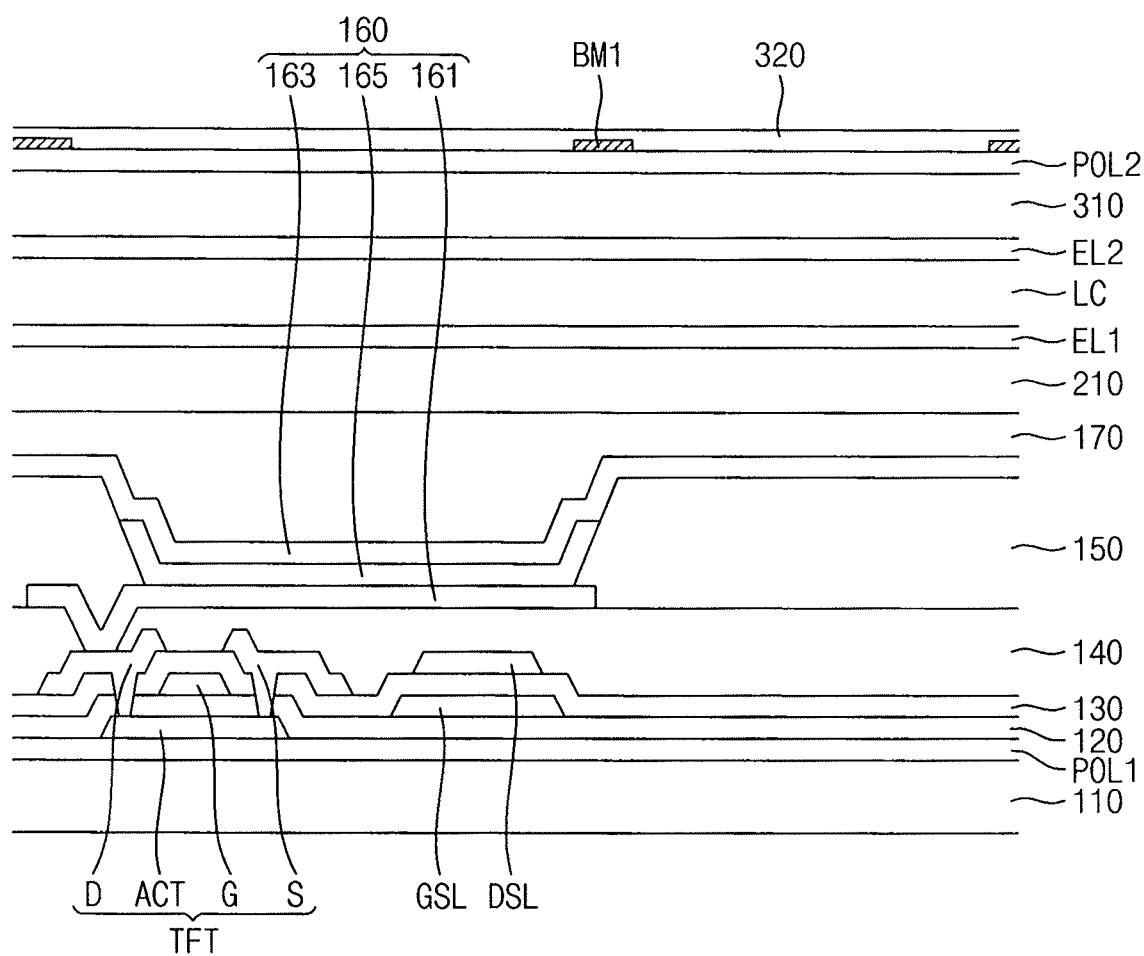
FIG. 6 illustrates a cross-sectional of a display apparatus according to an exemplary embodiment.

FIG. 6 is a cross-sectional illustrating a display apparatus according to an exemplary embodiment. Referring to FIG. 6, the display apparatus may be substantially same as the display apparatus of FIGS. 4A and 4B, except for the position of the first light blocking part BM1, the insulation layer 320, and the second polarizer POL2. Thus, any further detailed descriptions concerning the same elements will be omitted or briefly described.

Referring to FIG. 6, the display apparatus may include the first base substrate 110, the first polarizer POL1, the first insulation layer 120, the second insulation layer 130, the thin film transistor TFT, the planarization layer 140, the pixel defining layer 150, the organic light emitting element 160, the second base substrate 210, the first electrode EL1, the liquid crystal layer LC, the second electrode EL2, the third base substrate 310, the second polarizer POL2, the first light blocking part BM1, and the insulation layer 320, in that order.

The second polarizer POL2 may be disposed on the third base substrate 310. The first light blocking part BM1 may be disposed on the second polarizer POL2. The insulation layer 320 may be disposed on the first light blocking part BM1 to cover the first light blocking part BM1. The insulation layer 320 may be a protecting layer to protecting the display apparatus.

Figure 7A:
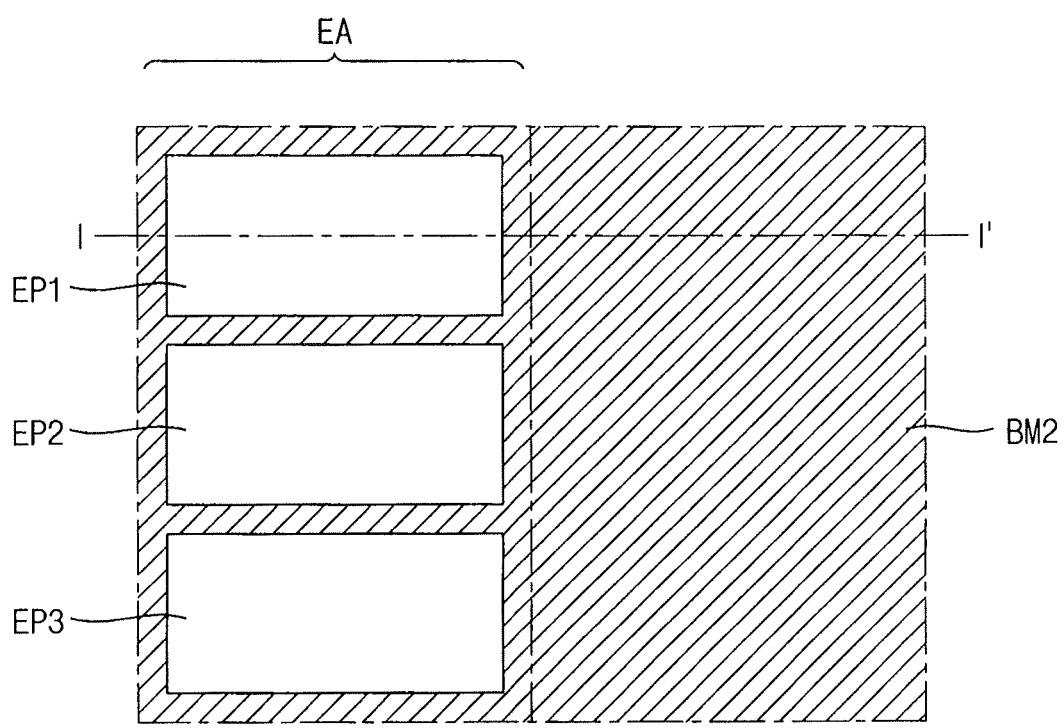
FIG. 7A illustrates a plan view of one pixel unit of a display apparatus according to an exemplary embodiment.
Figure 7B:
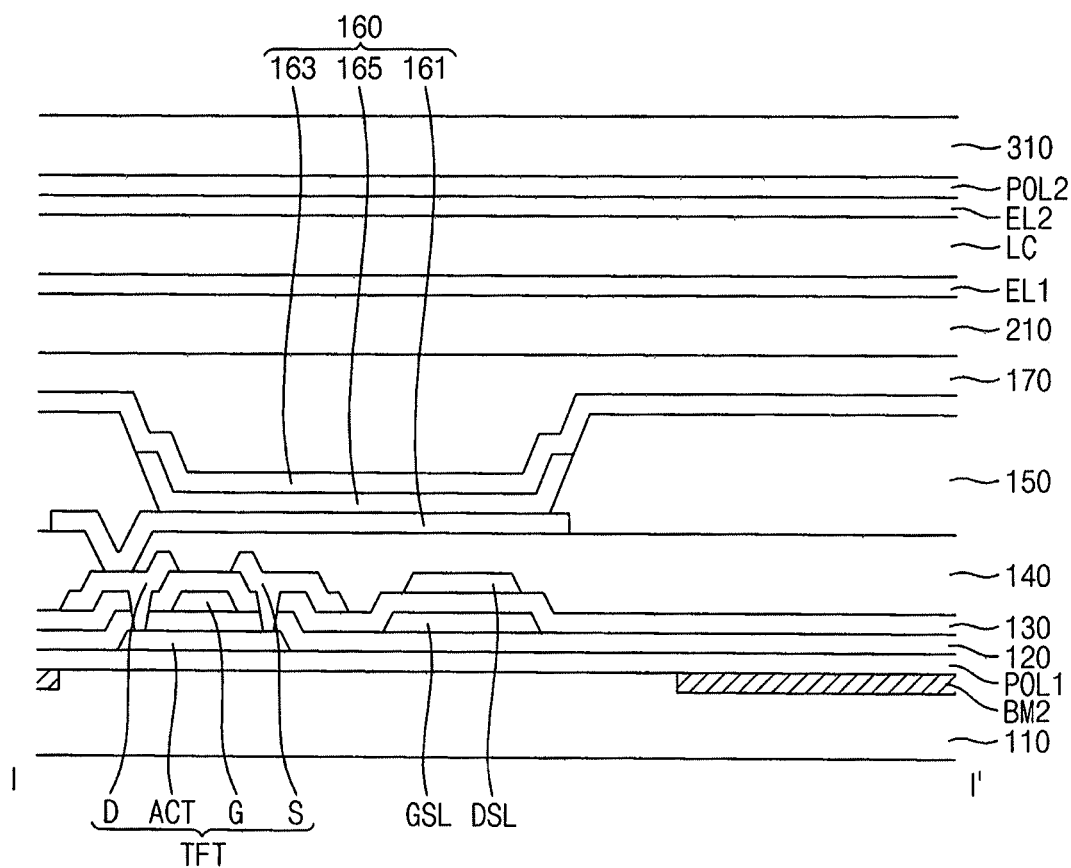
FIG. 7B illustrates a cross-sectional view taken along a line I-I' of FIG. 7A.

FIG. 7A is a plan view illustrating one pixel unit of a display apparatus according to an exemplary embodiment. FIG. 7B is a cross-sectional view taken along a line I-I' of FIG. 7A. Referring to FIGS. 7A and 7B, the display apparatus may be substantially same as the display apparatus of FIGS. 1A and 1B, except for the inclusion of a second light blocking part BM2. Thus, any further detailed descriptions concerning the same elements will be omitted or briefly described.

Referring to FIG. 7A, the display apparatus may include a plurality of pixel units to display an image. The pixel unit may include a light emitting area EA. The second light blocking part BM2 may be disposed at an area other than the first light emitting portion EP1, the second light emitting portion EP2, and the third light emitting portion EP3. The second light blocking part BM2 may include a material which blocks the external light. For example, the second light blocking part BM2 may include a metal oxide, e.g., a chromium oxide, which blocks light.

Referring to FIG. 7B, the display apparatus may include the first base substrate 110, the second light blocking part BM2, the first polarizer POL1, the first insulation layer 120, the second insulation layer 130, the thin film transistor TFT, the planarization layer 140, the pixel defining layer 150, the organic light emitting element 160, the second base substrate 210, the first electrode EL1, the liquid crystal layer LC, the second electrode EL2, the second polarizer POL2, and the third base substrate 310, in that order.

The second light blocking part BM2 may be disposed on the first base substrate 110. The second light blocking part BM2 may be formed on entirety of the second base substrate 110, e.g., in FIG. 7A, the light emitting portions are on top of the second light blocking part BM2. The first polarizer POL1 may be disposed on the second light blocking part BM2.

Figure 8:
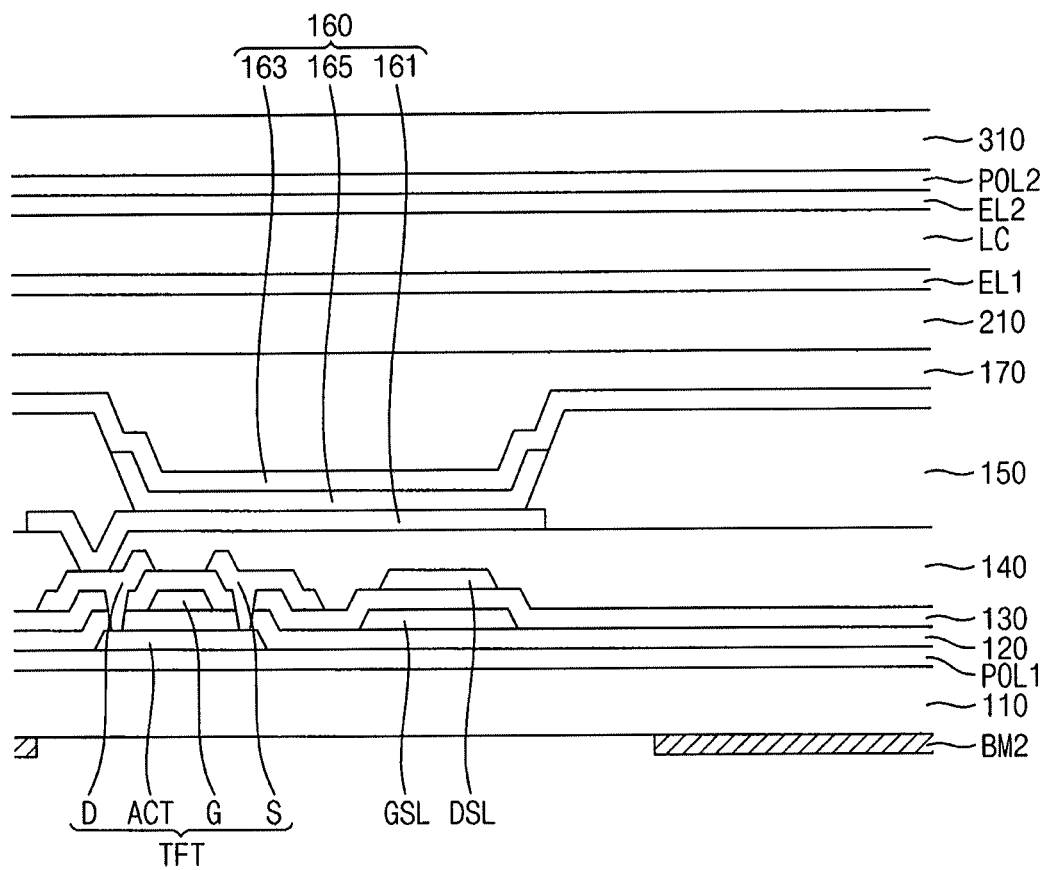
FIG. 8 illustrates a cross-sectional of a display apparatus according to an exemplary embodiment.

FIG. 8 is a cross-sectional illustrating a display apparatus according to an exemplary embodiment. Referring to FIG. 8, the display apparatus may be substantially same as the display apparatus of FIG. 7B, except that the second light blocking part BM2 is disposed under a first base substrate 110. Thus, any further detailed descriptions concerning the same elements will be omitted or briefly described.

The second light blocking part BM2 may be disposed on a surface of the first base substrate 110 which is opposite to a surface of the first base substrate 110 on which a first polarizer POL1 is disposed. The light blocking part BM2 may be formed on entirety of the second base substrate 110.

For example, the second light blocking part BM2 may be a light blocking film attached on the first base substrate 110.

According to the present example embodiment, the display apparatus may perform a mirror mode, mirror-display mode, a display mode and a black mode according to the on/off of the organic light emitting element 160 and the liquid crystal layer LC.

Figure 9:
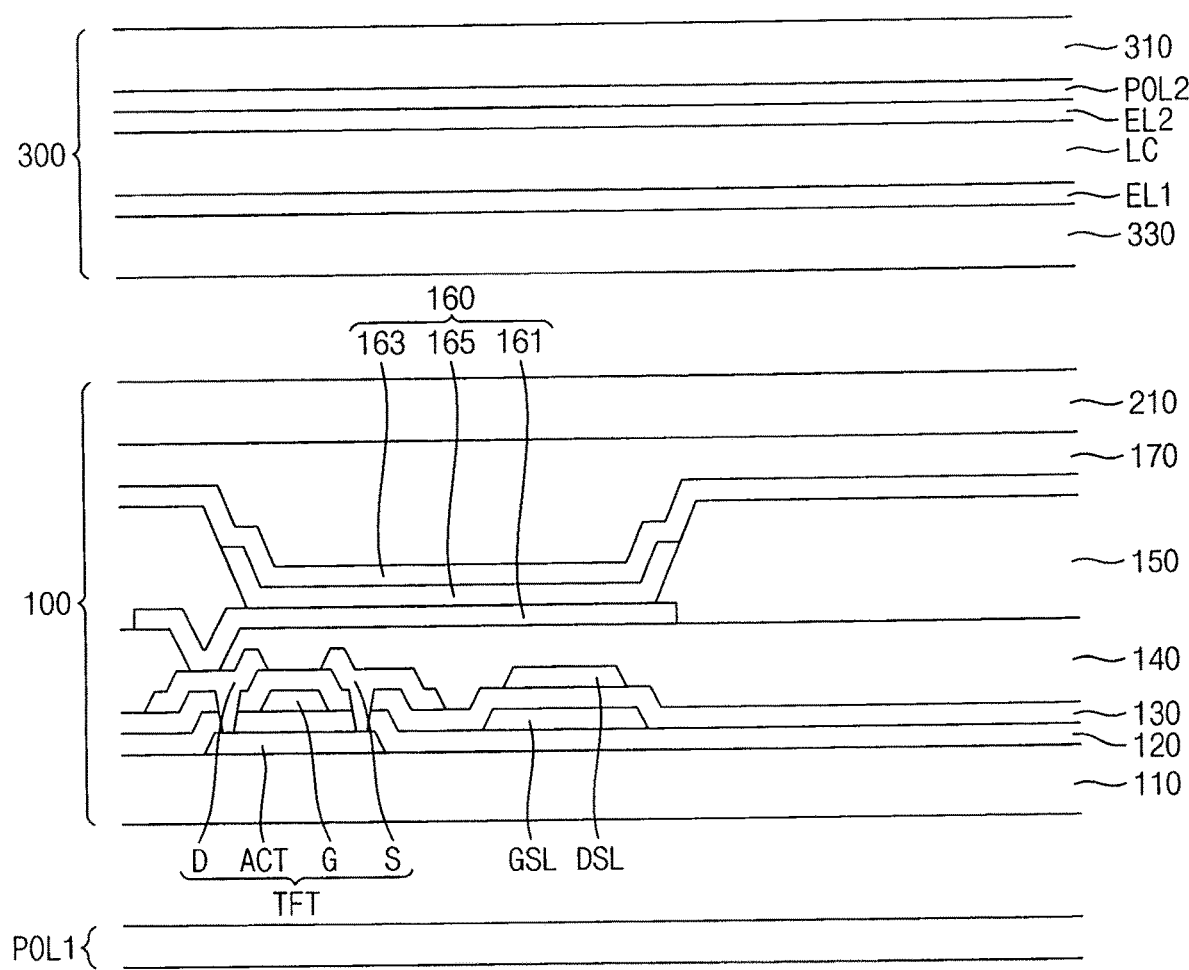
FIG. 9 illustrates a cross-sectional of a display apparatus according to an exemplary embodiment.

FIG. 9 is a cross-sectional illustrating a display apparatus according to an exemplary embodiment. Referring to FIG. 9, the display apparatus may include a first polarizer POL1, an organic light emitting display panel 100, and a liquid crystal switching panel 300.

The organic light emitting display panel 100 may include the first base substrate 110, the first insulation layer 120, the second insulation layer 130, the thin film transistor TFT, the planarization layer 140, the pixel defining layer 150, the organic light emitting element 160, and the second base substrate 210, in that order. The organic light emitting display panel 100 may be a transparent display panel having a front emission structure The first polarizer POL1 may be adjacent the first base substrate 110 of the organic light emitting display panel 100. The first polarizer POL1 may be spaced apart from the organic light emitting display panel 100. In some example embodiments, the first polarizer POL1 may be attached on the first base substrate 110 of the organic light emitting display panel 100.

The liquid crystal switching panel 300 may be adjacent the organic light emitting display panel 100 opposite to the first polarizer POL1 with respect to the organic light emitting display panel 100, e.g., the organic light emitting display panel 100 may be between and may overlap the liquid crystal switching panel 300 and the first polarizer POL1. The liquid crystal switching panel 300 may include the fourth base substrate 330, the first electrode EL1, the liquid crystal layer LC, the second electrode EL2, the second polarizer POL2, and the third base substrate 310, in that order. The fourth base substrate 330 may be disposed on the second base substrate 210 of the organic light emitting display panel 100.

Thus, the display apparatus may be formed by adding the liquid crystal switching panel 300 and the first polarizer POL1 to the organic light emitting display panel 100.

Figure 10:
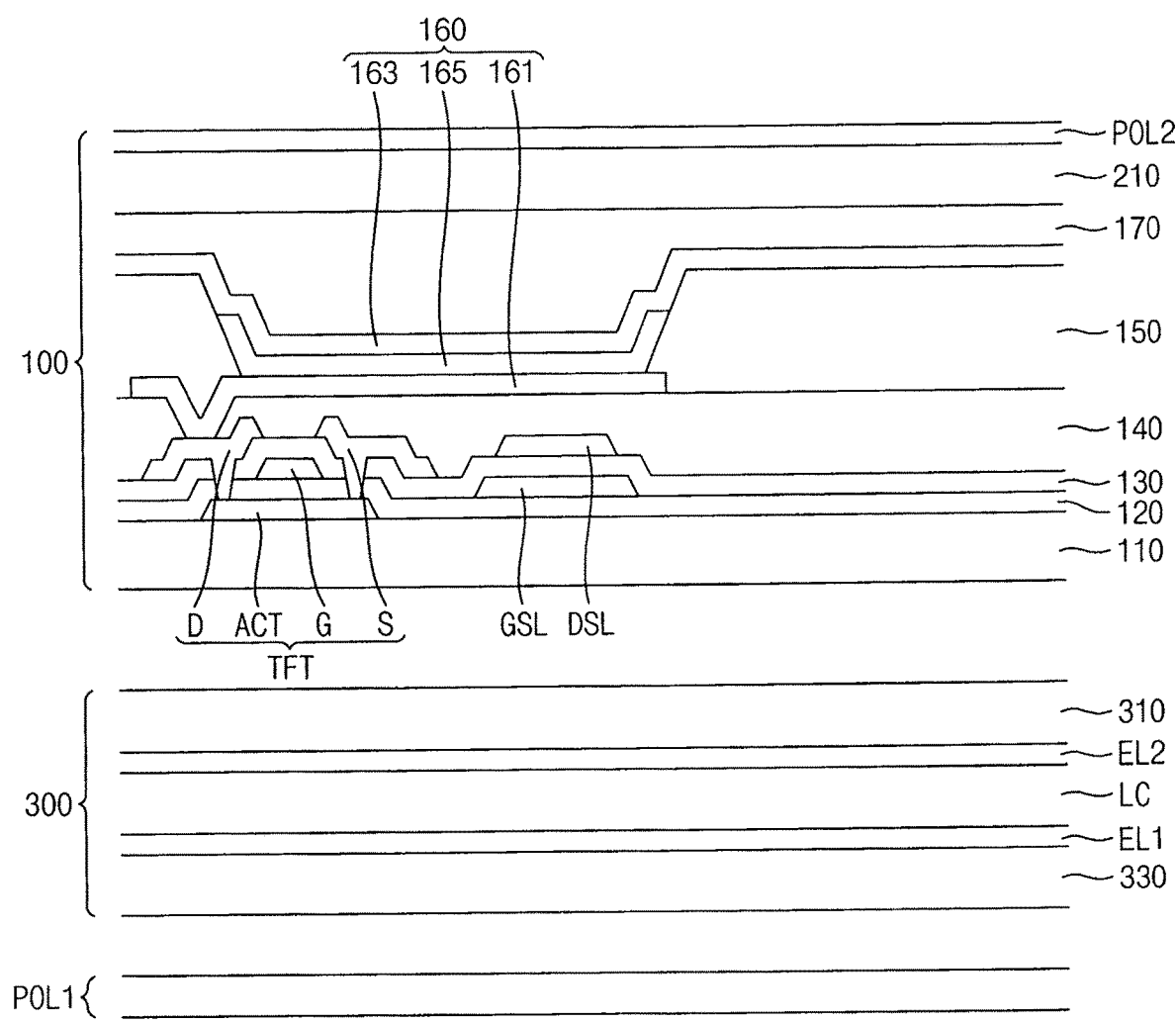
FIG. 10 illustrates a cross-sectional of a display apparatus according to an exemplary embodiment.

FIG. 10 is a cross-sectional illustrating a display apparatus according to an exemplary embodiment. Referring to FIG. 10, the display apparatus may be substantially same as the display apparatus of FIG. 9, except for positions of an organic light emitting display panel 100 and a liquid crystal switching panel 300. Thus, any further detailed descriptions concerning the same elements will be omitted or briefly described.

The display apparatus may include the first polarizer POL1, the organic light emitting display panel 100, and the liquid crystal switching panel 300. Here, the liquid crystal switching panel 300 may be between the first polarizer POL1 and the organic light emitting display panel 100. Further, the second polarizer POL2 may be on the second base substrate 210 which is part of the organic light emitting display panel in this embodiment.

Figure 11:
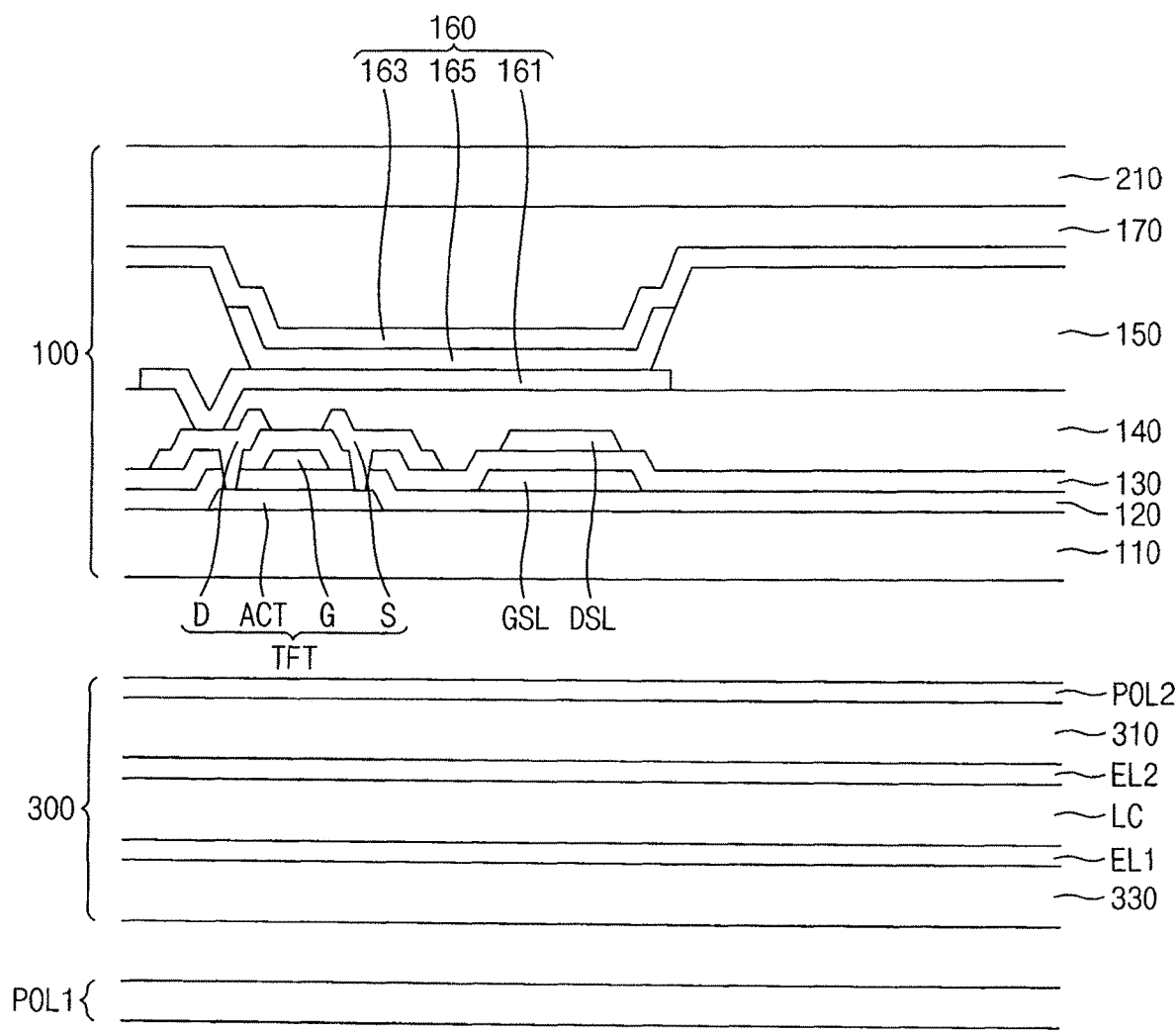
FIG. 11 illustrates a cross-sectional of a display apparatus according to an exemplary embodiment.

FIG. 11 is a cross-sectional illustrating a display apparatus according to an exemplary embodiment. The display apparatus may be substantially same as the display apparatus of FIG. 10, except for positions of first and second polarizers POL1 and POL2. Thus, any further detailed descriptions concerning the same elements will be omitted or briefly described.

Referring to FIG. 11, the first polarizer POL1 and the second polarizer POL2 may be disposed on adjacent an upper surface and lower surface of a liquid crystal switching panel 300, respectively. The first and second polarizers POL1 and POL2 may be disposed at other appropriate positions according to another example embodiment, as long as a liquid crystal switching panel SP, including the liquid crystal layer and first and second electrodes EL1, EL2, is between the polarizers.

FIGS. 12A to 12D are exploded perspective views illustrating different modes of operation of a display apparatus according to an exemplary embodiment. A mirror mode of the display apparatus is described in FIG. 12A. A mirror-display mode of the display apparatus is described in FIG. 12B. A transparent-display mode of the display apparatus is described in FIG. 12C. A transparent mode of the display apparatus is described in FIG. 12D.

The display apparatus may include the first polarizer POL1, the organic light emitting display panel OLED, the liquid crystal switching panel SP, and the second polarizer POL2. The liquid crystal switching panel SP may include the liquid crystal layer LC disposed between the first electrode EL1 and the second electrode EL2.

A first polarizing axis of the second polarizer POL2 may be 90 degrees. A second polarizing axis of the first polarizer POL1 may be 180 degrees. Thus, the second polarizer POL2 has polarizing axis which is perpendicular to that of the first polarizer POL1.

When in the on state, the liquid crystal switching panel SP may retard a phase of the light passing the liquid crystal layer LC by 45 degree. Alternatively, the phase of the light passing the liquid crystal layer LC is retarded by −45 degree. When the liquid crystal switching panel SP is in the off state, the light transmitted through the liquid crystal layer LC may maintain its phase.

Further, the organic light emitting display panel OLED may have an on state and an off state. When in the on state, the organic light emitting display panel OLED displays an image. When in the off state, the organic light emitting display panel OLED does not emit light.

Figure 12A:
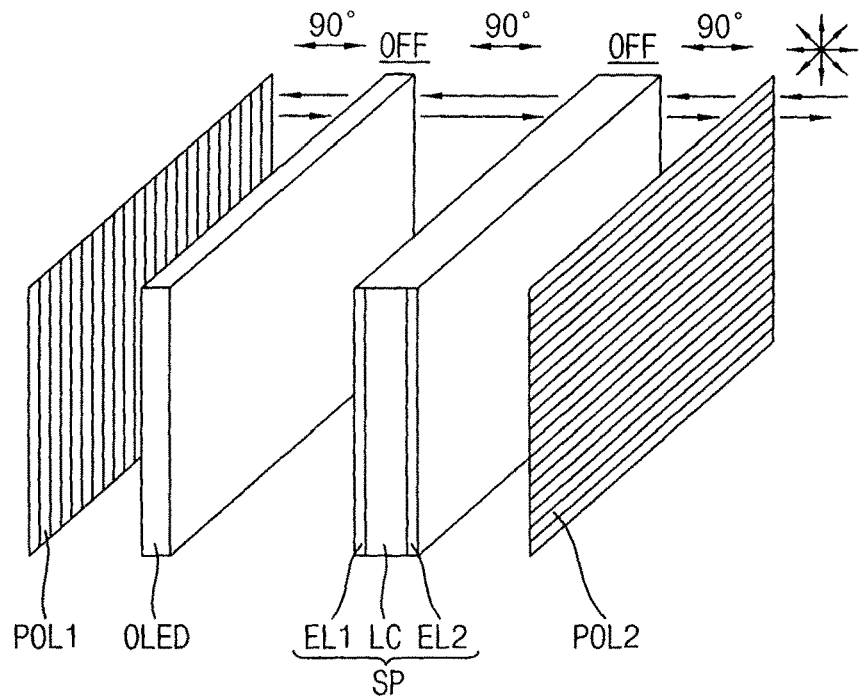
FIGS. 12A to 12D illustrate exploded perspective views of modes of operation of a display apparatus according to an exemplary embodiment; 0

Referring to FIG. 12A, in the mirror mode, the organic light emitting display panel OLED is in off state, and the liquid crystal switching panel SP is in off state. Thus, the organic light emitting display panel OLED does not emit light and does not display the image, and the liquid crystal layer LC does not change the phase of light passing the liquid crystal layer LC.

External light may pass the second polarizer POL2 and become 90 degree linearly polarized light. The 90 degree linearly polarized light may be transmitted by the liquid crystal switching panel SP and the organic light emitting display panel OLED. However, the 90 degree linearly polarized light cannot pass through the first polarizer POL1, but is reflected on the first polarizer POL1. Here, the reflected light is also 90 degree linearly polarized light, so that the reflected light may again pass through the organic light emitting display panel OLED, the liquid crystal switching panel SP, and the first polarizer POL1. Thus, the display apparatus may perform a mirror function.

In addition, the second polarizer POL2 may be a wire grid polarizer, so that a portion of the external light may be directly reflected by portions of the second polarizer POL2. The display apparatus may further include a light blocking part (BM1 of FIGS. 3A to 6) which has high reflectance, further reflecting external light.

Figure 12B:
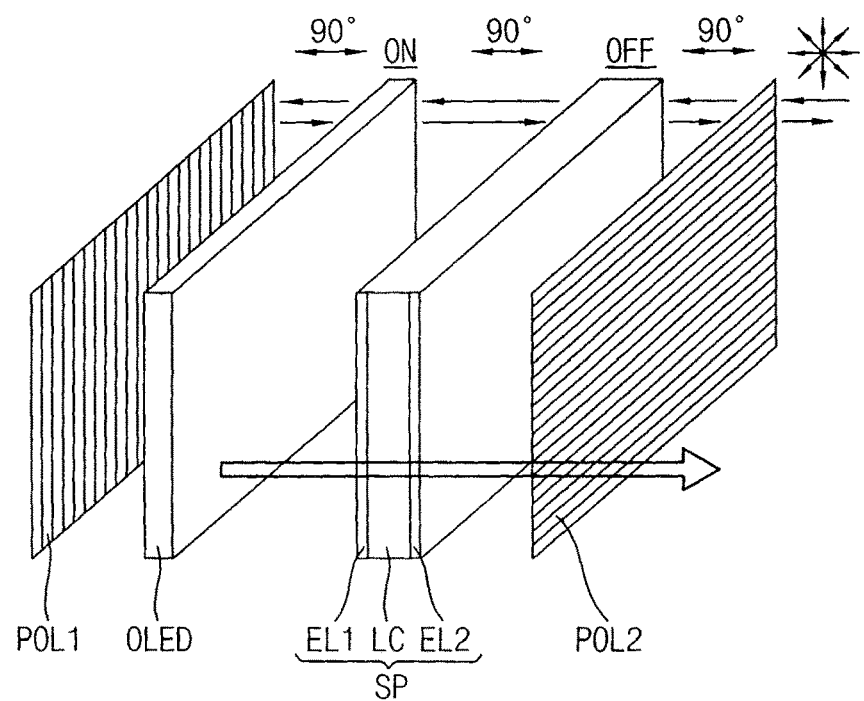

Referring to FIG. 12B, in the mirror-display mode, the organic light emitting display panel OLED is in on state, and the liquid crystal switching panel SP is in off state. Thus, the organic light emitting display panel OLED emits light and displays the image, and the liquid crystal layer LC does not change the phase of light passing the liquid crystal layer LC.

External light may pass the second polarizer POL2 and become 90 degree linearly polarized light. The 90 degree linearly polarized light may pass the liquid crystal switching panel SP and the organic light emitting display panel OLED. However, the 90 degree linearly polarized light cannot pass the first polarizer POL1, so that the 90 degree linearly polarized light may be reflected by the first polarizer POL1. Here, the reflected light is also 90 degree linearly polarized light, so that the reflected light may pass the organic light emitting display panel OLED, the liquid crystal switching panel SP, and the first polarizer POL1. Thus, the display apparatus may perform a mirror function.

Here, the organic light emitting display panel OLED emits and displays the image, and the image may be seen by users through the liquid crystal switching panel SP and the second polarizer POL2. Thus, the display apparatus may perform a mirror function and a display function. The image may be displayed on entire of the display apparatus or a portion of the display apparatus.

In addition, the second polarizer POL2 may be a wire grid polarizer, so that a portion of the external light may be directly reflected by portions of the second polarizer POL2. The display apparatus may further include a light blocking part (BM1 of FIGS. 3A to 6) which has high reflectance, further reflecting external light.

Figure 12C:
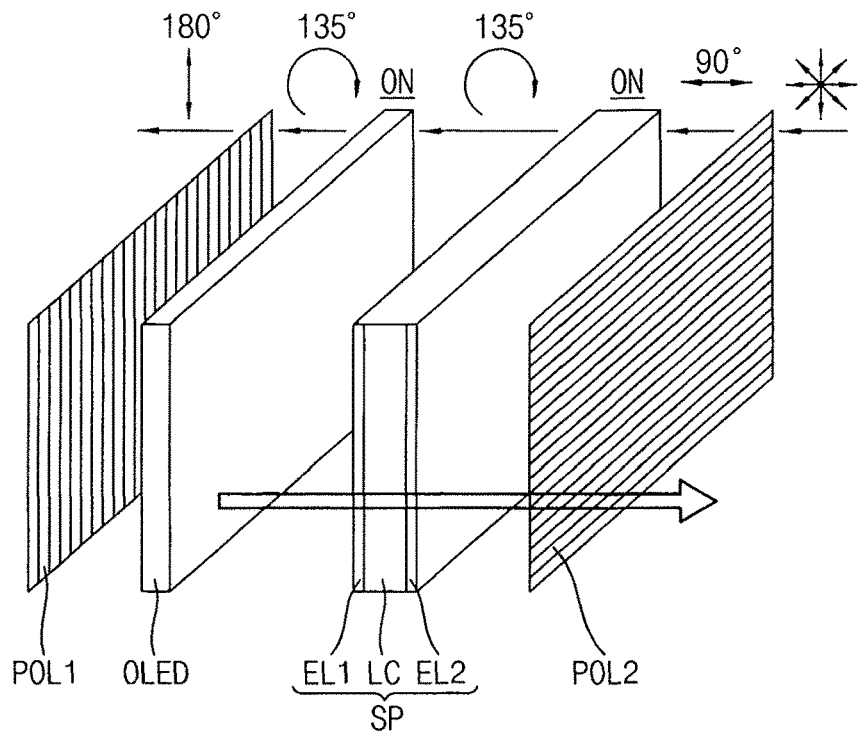

Referring to FIG. 12C, in the transparent-display mode, the organic light emitting display panel OLED is in on state, and the liquid crystal switching panel SP is in on state. Thus, the organic light emitting display panel OLED emits light and displays the image, and the liquid crystal layer LC retards the phase of light passing the liquid crystal layer LC by 45 degrees.

External light may pass the second polarizer POL2 and become 90 degree linearly polarized light. The 90 degree linearly polarized light may pass the liquid crystal switching panel SP which retards the light, so that the light becomes 135 degree circularly polarized light. The 135 degree circularly polarized light may be transmitted by the organic light emitting display panel OLED.

The 135 degree circularly polarized light which passed the organic light emitting display panel OLED is transmitted by the first polarizer POL1 and becomes 180 degree linearly polarized light. Accordingly, the external light may pass the display apparatus, and the display apparatus may performs as a transparent glass.

In addition, transmission image of an object disposed behind the display apparatus may pass through the display apparatus and users may recognize the transmission image. Specifically, light from the object passes the first polarizer POL1 and is polarized by 180 degrees, and then passes the organic light emitting display panel OLED. The liquid crystal switching panel SP outputs this light as 135 degree circularly polarized light, which is then transmitted by the second polarizer POL2 and becomes 90 degree linearly polarized light. Thus, the object behind the display apparatus may be viewed.

Here, the organic light emitting display panel OLED emits and displays image, and the image passes the liquid crystal switching panel SP and the second polarizer POL2, so that the user may see the image. Thus, the display apparatus may perform transparent glass function and display the image. The image may be displayed on entire of the display apparatus or a portion of the display apparatus.

Figure 12D:
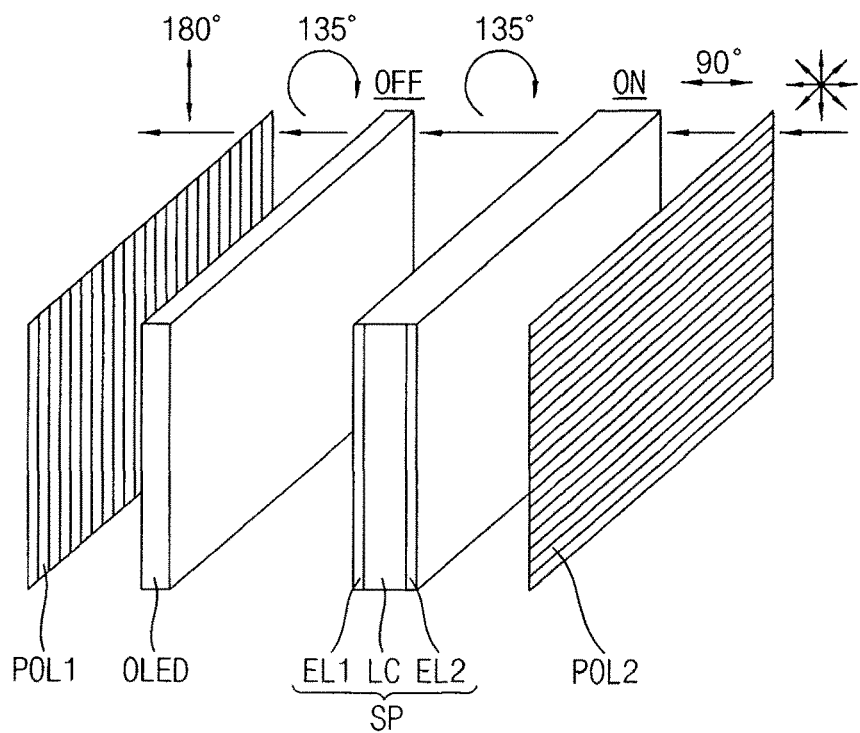

Referring to FIG. 12D, in the transparent mode, the organic light emitting display panel OLED is in off state, and the liquid crystal switching panel SP is in on state. Thus, the organic light emitting display panel OLED does not emit light and does not display the image, and the liquid crystal layer LC retards the phase of light passing the liquid crystal layer LC by 45 degree.

External light may pass the second polarizer POL2 and become 90 degree linearly polarized light. The 90 degree linearly polarized light may pass the liquid crystal switching panel SP and is retarded, so that the light becomes 135 degree circularly polarized light. The 135 degree circularly polarized light may pass through the organic light emitting display panel OLED.

The 135 degree circularly polarized light which passed the organic light emitting display panel OLED may be transmitted by the first polarizer POL1 and become 180 degree linearly polarized light. Accordingly, the external light may pass the display apparatus, and the display apparatus may performs as a transparent glass.

In addition, although the liquid crystal layer LC in the present example embodiment works as the optical retarder when the liquid crystal layer LC is in the on state, the liquid crystal layer LC may be designed to be the optical retarder when the liquid crystal layer LC is in the off state. For example, the liquid crystal layer LC of the liquid crystal switching panel SP may be designed according to whether the display apparatus should be work as mirror or transparent glass when all power about the display apparatus is off (the liquid crystal switching panel SP and the organic light emitting display panel OLED are both off).

FIGS. 13A to 13D are exploded perspective views illustrating modes of operation of a display apparatus according to an exemplary embodiment. A mirror mode of the display apparatus is described in FIG. 13A. A mirror-display mode of the display apparatus is described in FIG. 13B. A display mode of the display apparatus is described in FIG. 13C. A black mode of the display apparatus is described in FIG. 13D.

The display apparatus may include the first polarizer POL1, the organic light emitting display panel OLED, the liquid crystal switching panel SP, the second polarizer POL2, and the second light blocking part BM2. The liquid crystal switching panel SP may include the liquid crystal layer LC disposed between the first electrode EL1 and the second electrode EL2.

A first polarizing axis of the second polarizer POL2 may be 90 degrees. A second polarizing axis of the first polarizer POL1 may be 180 degrees. Thus, the second polarizer POL2 has polarizing axis which is perpendicular to that of the first polarizer POL1.

When on state, the liquid crystal switching panel SP may retard a phase of light passing the liquid crystal layer LC by 45 degree. Alternatively, light passing the liquid crystal layer LC is retarded by −45 degree. When the liquid crystal switching panel SP is in off state, the light passing the liquid crystal layer LC may maintain its phase.

Further, the organic light emitting display panel OLED may have an on state and an off state. When in the on state, the organic light emitting display panel OLED displays an image. When in the off state, the organic light emitting display panel OLED does not emit light.

Figure 13A:
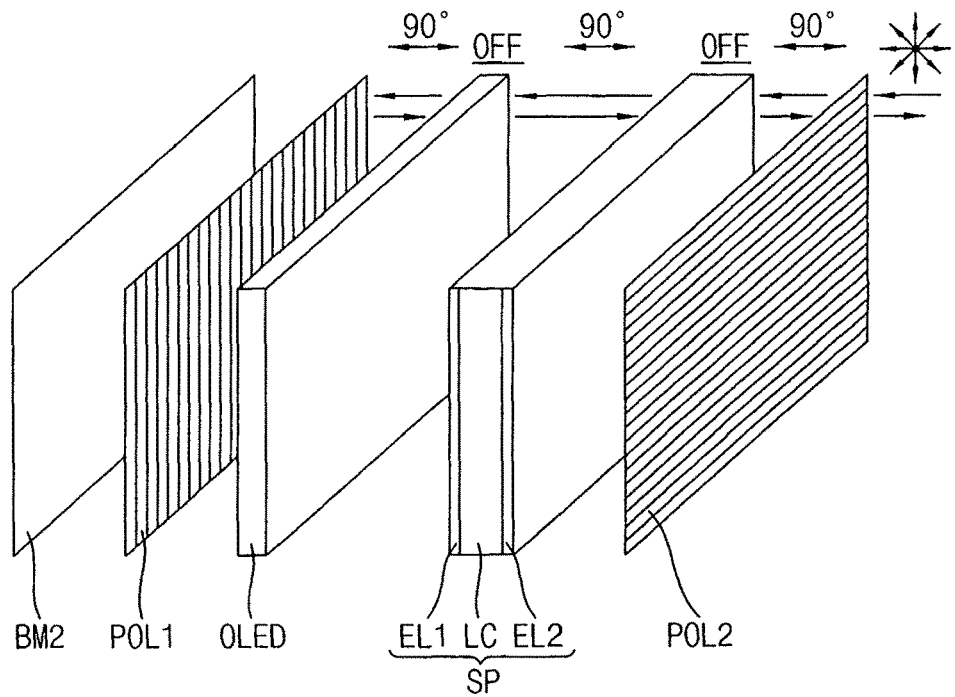
FIGS. 13A to 13D illustrate exploded perspective views of modes of operation of a display apparatus according to an exemplary embodiment.

Referring to FIG. 13A, in the mirror mode, the organic light emitting display panel OLED is in off state, and the liquid crystal switching panel SP is in off state. Thus, the organic light emitting display panel OLED does not emit light and does not display the image, and the liquid crystal layer LC does not change the phase of light passing the liquid crystal layer LC.

External light may pass the second polarizer POL2 and become 90 degree linearly polarized light. The 90 degree linearly polarized light may pass the liquid crystal switching panel SP and the organic light emitting display panel OLED, but cannot pass the first polarizer POL1, but may be reflected by the first polarizer POL1. Here, the reflected light is also 90 degree linearly polarized light, so that the reflected light may pass the organic light emitting display panel OLED, the liquid crystal switching panel SP, and the first polarizer POL1. Thus, the display apparatus may perform a mirror function.

In addition, the second polarizer POL2 may be a wire grid polarizer, so that a portion of the external light may be directly reflected by portions of the second polarizer POL2. The display apparatus may further include a light blocking part (BM1 of FIGS. 3A to 6) which has high reflectance, further reflecting external light.

Figure 13B:
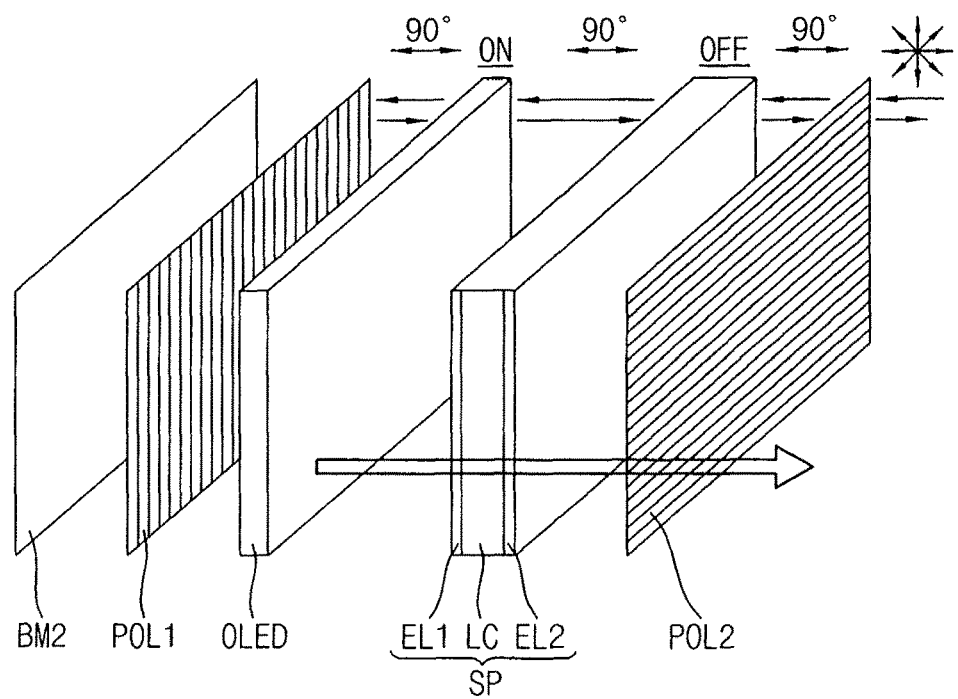

Referring to FIG. 13B, in the mirror-display mode, the organic light emitting display panel OLED is in on state, and the liquid crystal switching panel SP is in off state. Thus, the organic light emitting display panel OLED emits light and displays the image, and the liquid crystal layer LC does not change the phase of light passing the liquid crystal layer LC.

External light may pass the second polarizer POL2 and become 90 degree linearly polarized light. The 90 degree linearly polarized light may pass the liquid crystal switching panel SP and the organic light emitting display panel OLED, but cannot pass the first polarizer POL1, but may be reflected by the first polarizer POL1. Here, the reflected light is also 90 degree linearly polarized light, so that the reflected light may pass the organic light emitting display panel OLED, the liquid crystal switching panel SP the first polarizer POL1. Thus, the display apparatus may perform a mirror function.

Here, the organic light emitting display panel OLED emits and displays the image, and the image may be seen by users through the liquid crystal switching panel SP and the second polarizer POL2. Thus, the display apparatus may perform a mirror function and a display function. The image may be displayed on entire of the display apparatus or a portion of the display apparatus.

In addition, the second polarizer POL2 may be a wire grid polarizer, so that a portion of the external light may be directly reflected by portions of the second polarizer POL2. The display apparatus may further include a light blocking part (BM1 of FIGS. 3A to 6) which has high reflectance, further reflecting external light.

Figure 13C:
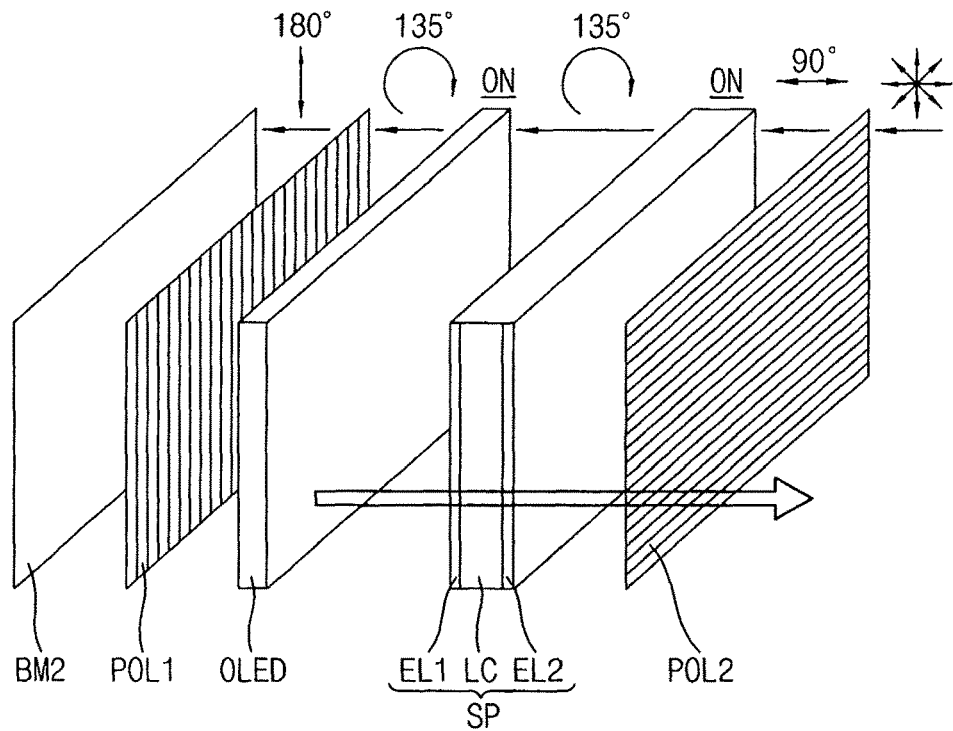

Referring to FIG. 13C, in the transparent-display mode, the organic light emitting display panel OLED is in on state, and the liquid crystal switching panel SP is in on state. Thus, the organic light emitting display panel OLED emits light and displays the image, and the liquid crystal layer LC retards the phase of light passing the liquid crystal layer LC by 45 degree.

External light may pass the second polarizer POL2 and become 90 degree linearly polarized light. The 90 degree linearly polarized light may pass the liquid crystal switching panel SP that retards the phase of the light, so that the light becomes 135 degree circularly polarized light. The 135 degree circularly polarized light may pass the organic light emitting display panel OLED.

The 135 degree circularly polarized light is transmitted by the first polarizer POL1 and becomes 180 degree linearly polarized light. The 180 degree linearly polarized light is blocked by the second light blocking part BM2, so that the display apparatus may perform as a traditional display apparatus.

Here, the organic light emitting display panel OLED emits and displays image, and the image passes the liquid crystal switching panel SP and the second polarizer POL2, so that the user may see the image. The image may be displayed on entire of the display apparatus or a portion of the display apparatus.

Figure 13D:
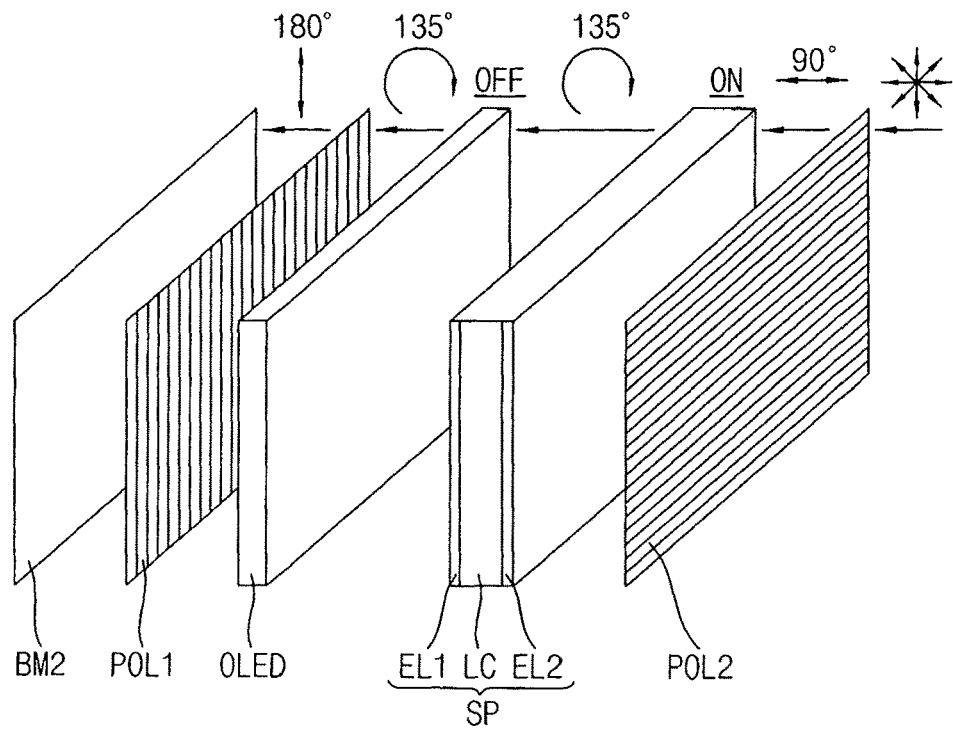

Referring to FIG. 13D, in the black mode, the organic light emitting display panel OLED is in off state, and the liquid crystal switching panel SP is in on state. Thus, the organic light emitting display panel OLED does not emit light and does not display the image, and the liquid crystal layer LC retards the phase of light passing the liquid crystal layer LC by 45 degrees.

External light may pass the second polarizer POL2 and become 90 degree linearly polarized light. The 90 degree linearly polarized light may pass the liquid crystal switching panel SP that retards the phase of the light, so that the light becomes 135 degree circularly polarized light. The 135 degree circularly polarized light may pass the organic light emitting display panel OLED.

The 135 degree circularly polarized light is then transmitted by the first polarizer POL1 and becomes 180 degree linearly polarized light. The 180 degree linearly polarized light is blocked by the second light blocking part BM2, and the organic light emitting display panel OLED is in off state, so that the display apparatus may be in back state which does not display the image.

In addition, although the liquid crystal layer LC in the present example embodiment works as the optical retarder when the liquid crystal layer LC is in the on state, the liquid crystal layer LC may be designed to be the optical retarder when the liquid crystal layer LC is in the off state.

Figure 14A:
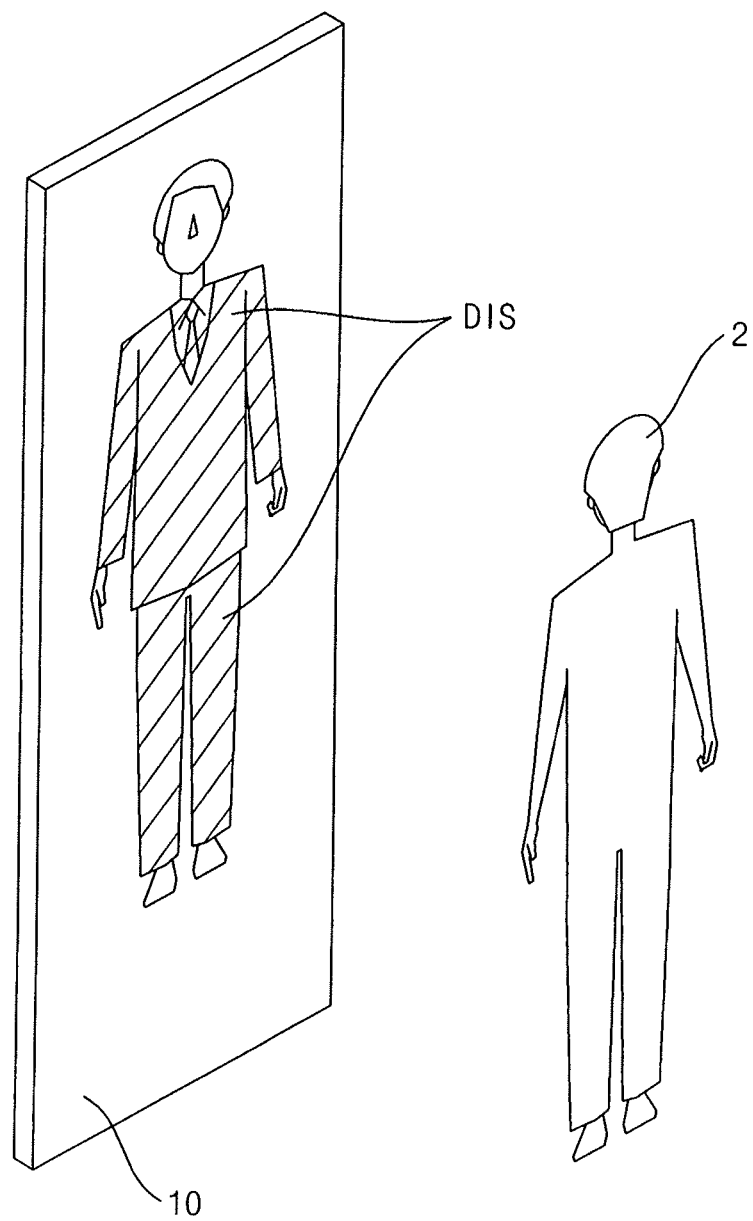
FIGS. 14A to 14B illustrate exploded perspective views of modes of operation of a display apparatus according to an exemplary embodiment.
Figure 14B:
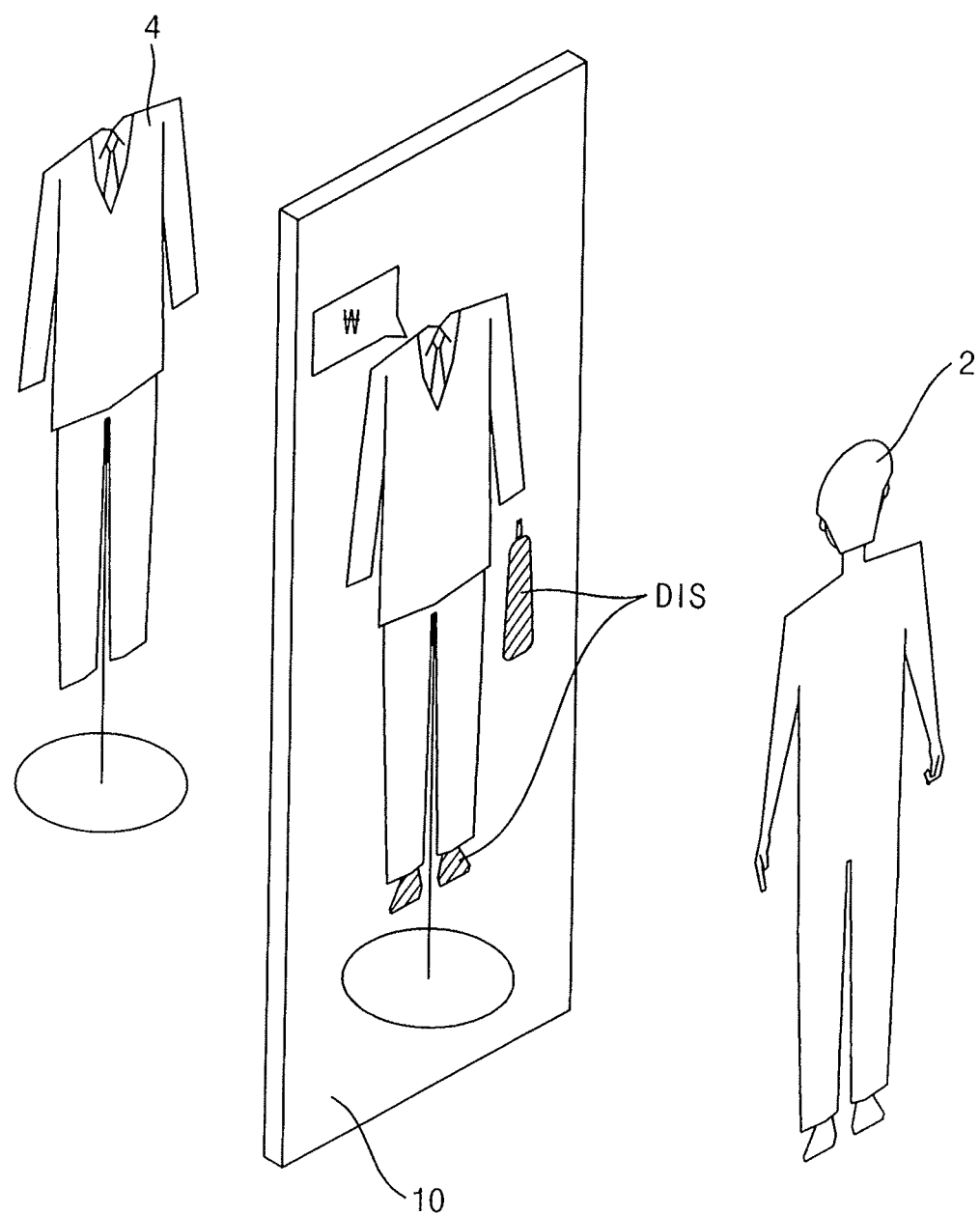

FIGS. 14A to 14B are exploded perspective views of modes of operation of a display apparatus 10 according to an exemplary embodiment. Although the following example embodiment, illustrates although the display apparatus 10 as being utilized in the garment industry, the display apparatus may be have various applications, e.g., may be utilized in industries such as automobile mirrors, glass, displays, etc.

Referring to FIG. 14A, the display apparatus 10 may be driven in a mirror-display mode. The display apparatus 10 may work as a mirror and display an image DIS. An object 2 which is disposed in front of the display apparatus 10 may be shown on the display apparatus 10 in a mirror image. The image DIS may be displayed on a portion of the display apparatus 10. Accordingly, the mirror image and the image DIS may be shown on the display apparatus 10 at the same time.

Referring to FIG. 14B, the display apparatus 10 may be driven in a transparent-display mode. The display apparatus 10 may work as a transparent glass and display an image DIS. An object 4 which is disposed behind the display apparatus 10 may be shown on the display apparatus 10 in a transmission image. The image DIS may be displayed on a portion of the display apparatus 10. Accordingly, the transmission image and the image DIS may be shown on the display apparatus 10 at the same time.

According to one or more embodiments, a display apparatus may include a first polarizer, an organic light emitting element, a liquid crystal layer and a second polarizer. The display apparatus may be driven in a mirror mode, a mirror-display mode, a transparent-display mode, and a transparent mode according to driving of the liquid crystal layer.

According to one or more embodiment, a display apparatus may include a first polarizer, an organic light emitting element, a liquid crystal layer, a second polarizer and a second light blocking part. The display apparatus may be driven in a mirror mode, a mirror-display mode, a display mode, and a black mode according to driving of the liquid crystal layer.

In addition, the display apparatus may further include a first light blocking part that reflects external light, so that mirror function of the display apparatus may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a first polarizer;
a second polarizer facing the first polarizer;
an organic light emitting element overlapping the first polarizer and the second polarizer, wherein the organic light emitting element includes a light emitting structure and a thin film transistor, the thin film transistor being electrically connected to the light emitting structure, wherein the organic light emitting element comprises a light emitting area for displaying an image, and a transmitting area through which light passes;
a liquid crystal switching panel between the first polarizer and the second polarizer; and
a first light blocking part disposed at a boundary of the light emitting area and the transmitting area to overlap the boundary, wherein the first light blocking part reflects light, and
the liquid crystal switching panel including:
a first electrode and a second electrode facing each other; and
a liquid crystal layer between the first electrode and the second electrode, wherein the organic light emitting element is between the liquid crystal layer and the first polarizer.

2. The display apparatus as claimed in claim 1, wherein the first polarizer is a wire grid polarizer.

3. The display apparatus as claimed in claim 2, wherein the wire grid polarizer comprises aluminum and/or silver, and a thickness of the wire grid polarizer has 50 nm (nanometers) or more.

4. The display apparatus as claimed in claim 1, wherein a first polarizing axis of the first polarizer and a second polarizing axis of the second polarizer are perpendicular to each other.

5. The display apparatus as claimed in claim 1, wherein phase of light which passes the liquid crystal layer is maintained or retarded by 45 degree according to voltages applied to the first and second electrodes.

6. The display apparatus as claimed in claim 1, wherein the light emitting structure has a pixel electrode electrically connected to the thin film transistor, an opposite electrode facing the pixel electrode, and an organic light emitting layer between the pixel electrode and the opposite electrode.

7. The display apparatus as claimed in claim 6, wherein:
the pixel electrode is disposed only at the light emitting area,
the light emitting area includes first and second light emitting portions being spaced apart from each other in a first direction, and
the transmitting area extends along sides of the first and second light emitting portions in the first direction.

8. The display apparatus as claimed in claim 1, wherein the second polarizer is a wire grid polarizer including a wire grid pattern, and the wire grid pattern and the first light blocking part are formed from a same layer.

9. The display apparatus as claimed in claim 1, wherein:
the display apparatus is driven in a mirror mode, a mirror-display mode, a transparent-display mode, and transparent mode according to on/off of the organic light emitting element and the liquid crystal layer,
the display apparatus works as a mirror in the mirror mode,
the display apparatus works as a mirror and displays an image in the mirror-display mode,
the display apparatus works as a transparent glass and displays an image in the transparent-display mode, and
the display apparatus works as a transparent glass in the transparent mode.

10. The display apparatus as claimed in claim 9, wherein:
in the mirror mode, the organic light emitting element is in off state and the liquid crystal switching panel is off state, so that the organic light emitting element does not emit light, and the liquid crystal layer does not change phase of light passing the liquid crystal layer,
in the mirror-display mode, the organic light emitting element is in on state and the liquid crystal switching panel is off state, so that the organic light emitting element emits light, and the liquid crystal layer does not change phase of light passing the liquid crystal layer,
in the transparent-display mode, the organic light emitting element is in on state and the liquid crystal switching panel is on state, so that the organic light emitting element emits light, and the liquid crystal layer retards the phase of light passing the liquid crystal layer by 45 degrees, and
wherein in the transparent mode, the organic light emitting element is in off state and the liquid crystal switching panel is on state, so that the organic light emitting element does not emit light, and the liquid crystal layer retards the phase of light passing the liquid crystal layer by 45 degrees.

11. The display apparatus as claimed in claim 1, further comprising a second light blocking part on the first polarizer opposite to the second polarizer with respect to the first polarizer.

12. The display apparatus as claimed in claim 11, wherein:
the display apparatus is driven in a mirror mode, a mirror-display mode, a display mode, and black mode according to on/off of the organic light emitting element and the liquid crystal layer,
the display apparatus works as a mirror in the mirror mode,
the display apparatus works as a mirror and displays an image in the mirror-display mode,
the display apparatus displays an image in the display mode, and
the display apparatus works as a black screen in the black mode.

13. The display apparatus as claimed in claim 1, wherein the second polarizer is a polyvinyl alcohol (PVA) polarizer.

14. The display apparatus as claimed in claim 1, wherein the display apparatus has a front emission structure.

15. A display apparatus, comprising:
- a first base substrate;
- a third base substrate facing the first base substrate;
- a second base substrate between the first base substrate and the third base substrate;
- a first polarizer on the first base substrate;
- an organic light emitting element between the first base substrate and the second base substrate, wherein the organic light emitting element comprises a light emitting area for displaying an image, and a transmitting area through which light passes;
- a first electrode, a liquid crystal layer, and a second electrode between the second base substrate and the third base substrate, wherein the organic light emitting element is between the liquid crystal layer and the first polarizer; and
- a first light blocking part disposed at a boundary of the light emitting area and the transmitting area to overlap the boundary, wherein the first light blocking part reflects light, and wherein
the organic light emitting element includes a light emitting structure and a thin film transistor, the thin film transistor being electrically connected to the light emitting structure.

16. The display apparatus as claimed in claim 15, wherein: the first polarizer comprises a wire grid polarizer having aluminum and/or silver, and a thickness of the wire grid polarizer has 50 nm (nanometers) or more.

17. The display apparatus as claimed in claim 15, further comprising a first light blocking part on the third base substrate.

18. The display apparatus as claimed in claim 17, wherein the first light blocking part defines a plurality of openings, and reflects external light.

19. The display apparatus as claimed in claim 15, further comprising a second light blocking part disposed on the second base substrate.

20. A display apparatus, comprising:
- a first polarizer comprising a wire grid pattern;
- a second polarizer facing the first polarizer;
- an organic light emitting element to display an image disposed between the first polarizer and the second polarizer, wherein the organic light emitting element comprises a light emitting area for displaying the image, and a transmitting area through which light passes;
- a liquid crystal switching panel to control phase of light disposed between the second polarizer and the organic light emitting element, wherein the organic light emitting element is between the liquid crystal switching panel and the first polarizer; and
- a first light blocking part disposed at a boundary of the light emitting area and the transmitting area to overlap the boundary, wherein the first light blocking part reflects light, wherein
the organic light emitting element includes a light emitting structure and a thin film transistor, the thin film transistor being electrically connected to the light emitting structure.

* * * * *